US010361297B2

(12) United States Patent
Kiyosawa

(10) Patent No.: US 10,361,297 B2
(45) Date of Patent: Jul. 23, 2019

(54) SEMICONDUCTOR EPITAXIAL WAFER, SEMICONDUCTOR DEVICE, AND METHOD OF PRODUCING SEMICONDUCTOR DEVICE

(71) Applicant: Panasonic Intellectual Property Management Co., Ltd., Osaka (JP)

(72) Inventor: Tsutomu Kiyosawa, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/896,490

(22) Filed: Feb. 14, 2018

(65) Prior Publication Data

US 2018/0254339 A1 Sep. 6, 2018

(30) Foreign Application Priority Data

Mar. 6, 2017 (JP) ................. 2017-041696

(51) Int. Cl.
| | | |
|---|---|---|
| H01L 29/78 | (2006.01) | |
| H01L 29/16 | (2006.01) | |
| H01L 29/423 | (2006.01) | |
| H01L 29/08 | (2006.01) | |
| H01L 29/417 | (2006.01) | |
| H01L 29/06 | (2006.01) | |
| H01L 29/10 | (2006.01) | |
| H01L 29/66 | (2006.01) | |

(52) U.S. Cl.
CPC ...... *H01L 29/7805* (2013.01); *H01L 29/0696* (2013.01); *H01L 29/086* (2013.01);
(Continued)

(58) Field of Classification Search
CPC .......... H01L 29/1608; H01L 29/1095; H01L 2924/13091; H01L 29/0696; H01L 29/7801; H01L 29/7802; H01L 29/7827
See application file for complete search history.

(56) References Cited

U.S. PATENT DOCUMENTS

| | | | | |
|---|---|---|---|---|
| 5,196,908 A | * | 3/1993 | Kusunoki | ............... H01L 29/10 257/327 |
| 5,729,030 A | * | 3/1998 | Yamamoto | ............. B82Y 20/00 257/103 |

(Continued)

FOREIGN PATENT DOCUMENTS

| | | |
|---|---|---|
| JP | 2012-094648 | 5/2012 |
| JP | 2012-104856 | 5/2012 |
| WO | 2010/125819 | 11/2010 |

*Primary Examiner* — Ngan V Ngo
(74) *Attorney, Agent, or Firm* — McDermott Will & Emery LLP

(57) ABSTRACT

A semiconductor epitaxial wafer includes a semiconductor wafer, and a semiconductor layer of a first conductivity type disposed on a main surface of the semiconductor wafer. The semiconductor epitaxial wafer includes a plurality of device regions. The plurality of device regions each include a body region of a second conductivity type in contact with the semiconductor layer, a source region of the first conductivity type in contact with the body region, and a channel layer that is constituted by a semiconductor, and that is disposed on the semiconductor layer so as to be in contact with at least a part of the body region. In a plane parallel to the main surface of the semiconductor wafer, a thickness distribution in the channel layer and a concentration distribution of the first conductivity type impurity in the channel layer are negatively correlated to each other.

15 Claims, 9 Drawing Sheets

(52) U.S. Cl.
CPC ...... *H01L 29/1045* (2013.01); *H01L 29/1095* (2013.01); *H01L 29/1608* (2013.01); *H01L 29/41741* (2013.01); *H01L 29/41766* (2013.01); *H01L 29/42368* (2013.01); *H01L 29/66068* (2013.01); *H01L 29/7801* (2013.01); *H01L 29/7802* (2013.01); *H01L 29/7827* (2013.01); *H01L 29/7828* (2013.01); *H01L 2924/13091* (2013.01)

(56) References Cited

U.S. PATENT DOCUMENTS

| | | | |
|---|---|---|---|
| 5,929,467 A * | 7/1999 | Kawai | H01L 21/28194 257/192 |
| 6,043,536 A * | 3/2000 | Numata | H01L 21/84 257/219 |
| 8,933,463 B2 * | 1/2015 | Adachi | H01L 29/1608 257/330 |
| 2008/0128702 A1 * | 6/2008 | Yamazaki | H01L 27/12 257/66 |
| 2011/0198616 A1 * | 8/2011 | Yamashita | H01L 21/047 257/77 |
| 2012/0057386 A1 | 3/2012 | Adachi et al. | |
| 2012/0139623 A1 * | 6/2012 | Hashimoto | H01L 29/66068 327/537 |
| 2013/0240871 A1 * | 9/2013 | Shimoda | B41J 2/161 257/43 |
| 2014/0239311 A1 * | 8/2014 | Kawai | H01L 29/66431 257/76 |
| 2016/0284982 A1 * | 9/2016 | Sasaki | G01R 33/098 |
| 2016/0293740 A1 * | 10/2016 | Sasaki | G01R 33/098 |
| 2018/0097069 A1 * | 4/2018 | Utsumi | H01L 29/1095 |

\* cited by examiner

SEMICONDUCTOR EPITAXIAL WAFER, SEMICONDUCTOR DEVICE, AND METHOD OF PRODUCING SEMICONDUCTOR DEVICE

BACKGROUND

1. Technical Field

The present disclosure relates to a semiconductor epitaxial wafer, a semiconductor device, and a method of producing a semiconductor device.

2. Description of the Related Art

Silicon carbide (SiC) is a semiconductor material having a greater bandgap and a greater degree of hardness than those of silicon (Si). SiC is used for power devices such as switching devices and rectifier devices. A power device made of SiC can advantageously reduce a power loss, for example, compared with a power device made of Si.

Typical semiconductor devices made of SiC include metal-insulator-semiconductor field-effect transistors (MISFETs) and Schottky-barrier diodes (SBDs). Metal-oxide-semiconductor field-effect transistor (MOSFET) is one kind of MISFETs.

A MISFET made of SiC (hereinafter referred to as "SiC-MISFET") is formed by using a silicon carbide epitaxial layer formed on a main surface of a silicon carbide wafer. Normally, a plurality of silicon carbide semiconductor devices (chips) are manufactured from a single silicon carbide wafer. In each of the silicon carbide semiconductor devices, a silicon carbide epitaxial layer includes a drift layer. A silicon carbide layer acting as a channel layer may be further disposed on a silicon carbide epitaxial layer.

In the specification, the term "silicon carbide wafer" denotes a substrate obtained by cutting, into a predetermined size, and polishing a piece of single crystal SiC produced with a modified Lely method or a sublimation method, for example. The term "silicon carbide epitaxial wafer" denotes a substrate in which a silicon carbide semiconductor layer, such as a silicon carbide epitaxial layer, is formed on a silicon carbide wafer. The term "silicon carbide epitaxial wafer" includes a substrate in which a plurality of silicon carbide semiconductor devices (SiC-MISFETs) are or only a part of its device structure is formed on a silicon carbide wafer formed with a silicon carbide epitaxial layer. The silicon carbide epitaxial wafer on which a plurality of silicon carbide semiconductor devices are formed is then cut into a predetermined chip size (dicing) so that the plurality of silicon carbide semiconductor devices are separated from each other. In the specification, the generic term "semiconductor wafer" denotes a semiconductor wafer made of SiC or gallium nitride (GaN), for example, while the generic term "semiconductor epitaxial wafer" denotes a substrate in which a semiconductor layer made of SiC or GaN, for example, is formed on the semiconductor wafer. A semiconductor epitaxial wafer includes a substrate on which a plurality of semiconductor devices are or only a part of its device structure is formed.

A silicon carbide layer having a relatively higher impurity concentration may sometimes be used as a channel layer of a SiC-MISFET. This can reduce a resistance (channel resistance) component when a current flows into the channel layer so that an ON-resistance Ron in the SiC-MISFET can be reduced.

By increasing impurity concentration in the channel layer, when a thickness of the channel layer is appropriate, the SiC-MISFET can function, in a transistor OFF mode, as a diode that allows a current to flow from a source electrode to a drain electrode via the channel layer. Such a diode is referred to as a "channel diode." In the specification, a direction from the drain electrode to the source electrode is referred to as "forward direction," while a direction from the source electrode to the drain electrode is referred to as "reverse direction." A direction toward which a channel diode allows a current to flow is the "reverse direction." An absolute value |Vf0| of a rising voltage of the channel diode is set smaller than an absolute value |Vf| of a rising voltage of a diode (hereinafter referred to as "body diode") that uses a "pn" junction present in the SiC-MISFET. Unexamined Japanese Patent Publication No. 2012-104856 and WO No. 2010/125819 A, for example, disclose SiC-MISFETs incorporating a channel diode.

When a SiC-MISFET is used as a switching device for a power converter, for example, the SiC-MISFET may allow a reflux current to flow into the power converter when the SiC-MISFET is turned off. In an ordinary inverter circuit, an external reflux diode, such as an SBD, is coupled in anti-parallel to a SiC-MISFET so as to use the reflux diode as a path for a reflux current. On the other hand, in a SiC-MISFET incorporating a channel diode, no external reflux diode is required, beneficially reducing a number of p arts.

SUMMARY

A semiconductor epitaxial wafer according to a first aspect of the present disclosure includes a semiconductor wafer, and a semiconductor layer of a first conductivity type disposed on a main surface of the semiconductor wafer. The semiconductor epitaxial wafer includes a plurality of device regions. The plurality of device regions each includes a body region of a second conductivity type in contact with the semiconductor layer, a source region of the first conductivity type in contact with the body region, and a channel layer constituted by a semiconductor, the channel layer being disposed on the semiconductor layer so as to be in contact with at least a part of the body region. The channel layer contains a first conductivity type impurity at a concentration ranging from $1 \times 10^{18}$ cm$^{-3}$ to $1 \times 10^{19}$ cm$^{-3}$, inclusive, and has a thickness ranging from 10 nm to 100 nm, inclusive. In a plane parallel to the main surface of the semiconductor wafer, a thickness distribution in the channel layer and a concentration distribution of the first conductivity type impurity in the channel layer are negatively correlated to each other.

A semiconductor epitaxial wafer according to a second aspect of the present disclosure includes a semiconductor wafer, and a semiconductor layer of a first conductivity type disposed on a main surface of the semiconductor wafer. The semiconductor epitaxial wafer includes a plurality of device regions. The plurality of device regions each include a body region of a second conductivity type in contact with the semiconductor layer, a source region of the first conductivity type in contact with the body region, a channel layer constituted by a semiconductor, the channel layer being disposed on the semiconductor layer so as to be in contact with at least a part of the body region, a gate insulation film disposed on the channel layer, and a gate electrode disposed on the gate insulation film. The channel layer contains a first conductivity type impurity at a concentration ranging from $1 \times 10^{18}$ cm$^{-3}$ to $1 \times 10^{19}$ cm$^{-3}$, inclusive, and has a thickness ranging from 10 nm to 100 nm, inclusive. In a plane parallel to the main surface of the semiconductor wafer, a thickness distribution in the channel layer and a thickness distribution in the gate insulation film are positively correlated to each other.

With the above described aspects of the present disclosure, a semiconductor epitaxial wafer or a semiconductor device, which is capable of reducing variations in device characteristics in a plane parallel to a main surface of a semiconductor wafer, can be provided.

DETAILED DESCRIPTION OF EMBODIMENT

Figure 1:
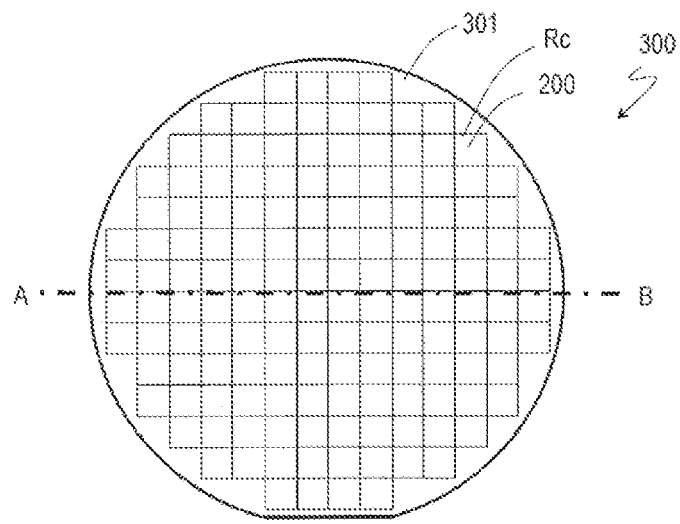
FIG. 1 is a plan view illustrating a silicon carbide epitaxial wafer according to an exemplary embodiment.

To increase a yield rate in production of semiconductor devices, such as SiC-MISFETs, variations of device characteristics including gate threshold voltage Vth and ON-resistance Ron are required to be reduced in a plane parallel to a main surface of a semiconductor wafer (hereinafter referred to as "within a surface of a semiconductor wafer"), i.e., it is required to be reduced among a plurality of chips or within a chip formed on the semiconductor wafer. Details will be described later.

An exemplary embodiment of the present disclosure provides a semiconductor epitaxial wafer or a semiconductor device, which is capable of reducing variations in device characteristics in a plane parallel to a main surface of the semiconductor wafer.

The following description is a knowledge base for the present disclosure.

As described above, a SiC-MISFET can function as a channel diode during a transistor OFF state by controlling an impurity concentration (carrier concentration) and a thickness of a channel layer, for example. At this time, depending on a thickness of the channel layer, the impurity concentration in the channel layer is set relatively higher (e.g., $1 \times 10^{18}$ cm$^{-3}$ or higher). When an impurity concentration in a channel layer is increased, however, gate threshold voltage Vth of a SiC-MISFET becomes susceptible to variations within a surface, such as a thickness of and the impurity concentration in the channel layer, for example. As a result, device characteristics including gate threshold voltage Vth and ON-resistance Ron would be likely to vary, across a plurality of chips or within a chip formed on a surface of a silicon carbide wafer. According to a result of an experiment performed on a 3-inch silicon carbide wafer, described later, when a thickness of a channel layer varies within a range of ±5% and an impurity concentration in the channel layer varies within a range of ±20%, gate threshold voltage Vth varies within a range of ±0.6 V and ON-resistance Ron varies within a range of ±6 mΩ.

Conventionally, to make device characteristics even as much as possible within a surface, conditions for forming a channel layer have been selected so as to reduce variations within a surface of a channel layer. According to an investigation performed by the inventor of the present disclosure, however, there is a limit in reducing variations within a surface of a channel layer depending on a method and a condition for forming a channel layer. In a channel layer containing an impurity at a higher concentration, in particular, it is difficult to keep an impurity concentration within a range of a several % within a surface of a silicon carbide wafer. When a silicon carbide wafer having a greater diameter (e.g., six inches and eight inches) will be required in the future, it becomes further difficult to reduce variations within a surface of a channel layer.

Even in a MISFET made of a semiconductor material other than silicon carbide, increasing an impurity concentration in a channel layer can also lead to variations of the channel layer within a surface of a semiconductor wafer, as the same as described above.

To solve the above described problems, the inventor of the present disclosure has investigated a method that can reduce variations in device characteristic even if a variation is present within a surface of a channel layer. As a result, the inventor of the present disclosure has found that variations in device characteristics can be reduced by allowing a channel layer to have a predetermined thickness distribution and a predetermined impurity concentration distribution, and by utilizing the distributions. The inventor of the present disclosure has also found that variations in device characteristics can be reduced by utilizing a thickness distribution in a channel layer and a thickness distribution in a gate insulation film. According to the exemplary embodiment of the present disclosure, an amount of variation in gate threshold voltage Vth due to a thickness distribution in a channel layer is compensated with an amount of variation in gate threshold voltage Vth due to an impurity concentration distribution in the channel layer, for example. A semiconductor epitaxial wafer or a semiconductor device with reduced variations in device characteristics within a surface can therefore be provided.

Abstract of one aspect of the present disclosure is as follows.

In an exemplary embodiment according to the first aspect of the present disclosure, a semiconductor epitaxial wafer includes a semiconductor wafer, and a semiconductor layer of a first conductivity type disposed on a main surface of the semiconductor wafer. The semiconductor epitaxial wafer includes a plurality of device regions. The plurality of device regions each includes a body region of a second conductivity type, a source region of the first conductivity type, and a channel layer constituted by a semiconductor. The body region is in contact with the semiconductor layer. The source region is in contact with the body region. The channel layer is disposed on the semiconductor layer so as to be in contact with at least a part of the body region. The channel layer contains a first conductivity type impurity at a concentration ranging from $1\times10^{18}$ cm$^{-3}$ to $1\times10^{19}$ cm$^{-3}$, inclusive, and has a thickness ranging from 10 nm to 100 nm, inclusive. In a plane parallel to the main surface of the semiconductor wafer, a thickness distribution in the channel layer and a concentration distribution of the first conductivity type impurity in the channel layer are negatively correlated to each other.

When thicknesses of the channel layer at two points "a" and "b" optionally defined in the plane parallel to the main surface of the semiconductor wafer are represented by Da and Db, respectively, while concentrations of the first conductivity type impurity in the channel layer at the two points "a" and "b" are represented by Ca and Cb, respectively, an inequality of Ca<Cb may be satisfied when an inequality of Da>Db is satisfied, or an inequality of Ca>Cb may be satisfied when an inequality of Da<Db is satisfied.

The plurality of device regions each further includes a gate insulation film disposed on the channel layer, and a gate electrode disposed on the gate insulation film, for example. In the plane parallel to the main surface of the semiconductor wafer, a thickness distribution in the channel layer and a thickness distribution in the gate insulation film may be positively correlated to each other.

In the plane parallel to the semiconductor wafer, a difference between a maximum value and a minimum value in the thickness distribution in the channel layer may range from 2 nm to 20 nm, inclusive, for example, while a difference between a maximum value and a minimum value in the concentration distribution of the first conductivity type impurity in the channel layer may range from $2\times10^{17}$ cm$^{-3}$ to $2\times10^{18}$ cm$^{-3}$, inclusive, for example.

For a concentration of the first conductivity type impurity in the channel layer, a concentration in a center portion of the semiconductor wafer may be lower than a concentration in a peripheral portion of the semiconductor wafer, for example. For a thickness of the channel layer, a thickness in the center portion of the semiconductor wafer may be greater than a thickness in the peripheral portion of the semiconductor wafer, for example.

In an exemplary embodiment according to the second aspect of the present disclosure, a semiconductor epitaxial wafer includes a semiconductor wafer, and a semiconductor layer of a first conductivity type disposed on a main surface of the semiconductor wafer. The semiconductor epitaxial wafer includes a plurality of device regions. The plurality of device regions each includes a body region of a second conductivity type, a source region of the first conductivity type, a channel layer constituted by a semiconductor, a gate insulation film, and a gate electrode. The body region is in contact with the semiconductor layer. The source region is in contact with the body region. The channel layer is disposed on the semiconductor layer so as to be in contact with at least a part of the body region. The gate insulation film is disposed on the channel layer. The gate electrode is disposed on the gate insulation film. The channel layer contains a first conductivity type impurity at a concentration ranging from $1\times10^{18}$ cm$^{-3}$ to $1\times10^{19}$ cm$^3$, inclusive, and has a thickness ranging from 10 nm to 100 nm, inclusive. In a plane parallel to the semiconductor wafer, a thickness distribution in the channel layer and a thickness distribution in the gate insulation film are positively correlated to each other.

When thicknesses of the channel layer at two points "a" and "b" optionally defined in the plane parallel to the main surface of the semiconductor wafer are represented by Da and Db, respectively, while thicknesses of the gate insulation film at the two points "a" and "b" are represented by Ta and Tb, respectively, an inequality of Ta>Tb may be satisfied when an inequality of Da>Db is satisfied, or an inequality of Ta<Tb may be satisfied when an inequality of Da<Db is satisfied.

The channel layer and the gate insulation film may both have a greater thickness in a center portion of the semiconductor wafer than a thickness in a peripheral portion of the semiconductor wafer.

The gate insulation film is a thermal oxide film, for example.

The semiconductor wafer is a silicon carbide wafer, for example, the semiconductor layer is a silicon carbide semiconductor layer, for example, and the channel layer is constituted by a silicon carbide semiconductor, for example.

In an exemplary embodiment according to a third aspect of the present disclosure, a semiconductor device includes a semiconductor substrate, a semiconductor layer of a first conductivity type, a body region of a second conductivity type, a source region of the first conductivity type, and a channel layer constituted by a semiconductor. The semiconductor layer is disposed on a main surface of the semiconductor substrate. The body region is in contact with the semiconductor layer. The source region is in contact with the body region. The channel layer is disposed on the semiconductor layer so as to be in contact with at least a part of the body region. The channel layer contains a first conductivity type impurity at a concentration ranging from $1\times10^{18}$ cm$^{-3}$ to $1\times10^{19}$ cm$^{-3}$, inclusive, and has a thickness ranging from 10 nm to 100 nm, inclusive. In a plane parallel to the main surface of the semiconductor substrate, a thickness distribution in the channel layer and a concentration distribution of the first conductivity type impurity in the channel layer are negatively correlated to each other.

The above described semiconductor device further includes a gate insulation film disposed on the channel layer, and a gate electrode disposed on the gate insulation film, for example. In the plane parallel to the main surface of the semiconductor substrate, the thickness distribution in the channel layer and a thickness distribution in the gate insulation film may be positively correlated to each other.

In the plane parallel to the main surface of the semiconductor substrate, a difference between a maximum value and a minimum value in the thickness distribution in the channel layer may range from 1 nm to 5 nm, inclusive, for example, while a difference between a maximum value and a minimum value in the concentration distribution of the first conductivity type impurity in the channel layer may range from $1\times10^{17}$ cm$^{-3}$ to $1\times10^{18}$ cm$^{-3}$, inclusive, for example.

In the plane parallel to the main surface of the semiconductor substrate, a difference between a maximum value and a minimum value in the thickness distribution in the channel layer may range from 1 nm to 2 nm, inclusive, for example, while a difference between a maximum value and a minimum value in the concentration distribution of the first conductivity type impurity in the channel layer may range from $1\times10^{17}$ cm$^{-3}$ to $2\times10^{17}$ cm$^{-3}$, inclusive, for example.

In an exemplary embodiment according to a fourth aspect of the present disclosure, a semiconductor device includes a semiconductor substrate, a semiconductor layer of a first conductivity type, a body region of a second conductivity type, a source region of the first conductivity type, and a channel layer constituted by a semiconductor, a gate insulation film, and a gate electrode. The semiconductor layer is disposed on a main surface of the semiconductor substrate. The body region is in contact with the semiconductor layer. The source region is in contact with the body region. The channel layer is disposed on the semiconductor layer so as to be in contact with at least a part of the body region. The gate insulation film is disposed on the channel layer. The gate electrode is disposed on the gate insulation film. The channel layer contains a first conductivity type impurity at a concentration ranging from $1\times10^{18}$ cm$^{-3}$ to $1\times10^{19}$ cm$^{-3}$, inclusive, and has a thickness ranging from 10 nm to 100 nm, inclusive. In a plane parallel to the main surface of the semiconductor substrate, a thickness distribution in the channel layer and a thickness distribution in the gate insulation film are positively correlated to each other.

The semiconductor substrate is a silicon carbide substrate, for example, the semiconductor layer is a silicon carbide semiconductor layer, for example, and the channel layer is a silicon carbide semiconductor, for example.

In an exemplary embodiment according to a fifth aspect of the present disclosure, a method of producing semiconductor devices includes performing steps (A) and (B). In step (A), a semiconductor epitaxial wafer is prepared. The semiconductor epitaxial wafer includes a semiconductor wafer, and a semiconductor layer. The semiconductor layer is disposed on a main surface of the semiconductor wafer. The semiconductor layer contains a first conductivity type impurity. The semiconductor epitaxial wafer further includes a plurality of device regions. The plurality of device regions each includes a body region of a second conductivity type in contact with the semiconductor layer, and a source region of the first conductivity type in contact with the body region. In step (B), a channel layer is formed so as to be in contact with at least a part of the body region by epitaxial growth of a semiconductor on a surface of the semiconductor layer. The channel layer contains the first conductivity type impurity at a concentration ranging from $1\times10^{18}$ cm$^{-3}$ to $1\times10^{19}$ cm$^{-3}$, inclusive, and has a thickness ranging from 10 nm to 100 nm, inclusive. In step (B), a condition for the epitaxial growth is controlled so that, in a plane parallel to the main surface of the semiconductor wafer, a thickness distribution in the channel layer and a concentration distribution of the first conductivity type impurity in the channel layer are negatively correlated to each other.

The above described production method further includes step (C) in which a gate insulation film is formed on the channel layer, for example. In steps (B) and (C), a condition for the epitaxial growth and a condition for forming the gate insulation film may be controlled so that, in the plane parallel to the main surface of the semiconductor wafer, the thickness distribution in the channel layer and a thickness distribution in the gate insulation film are positively correlated to each other.

In an exemplary embodiment according to a sixth aspect of the present disclosure, a method of producing semiconductor devices includes performing steps (A), (B), and (C). In step (A), a semiconductor epitaxial wafer is prepared. The semiconductor epitaxial wafer includes a semiconductor wafer, and a semiconductor layer. The semiconductor layer is disposed on a main surface of the semiconductor wafer. The semiconductor layer contains a first conductivity type impurity. The semiconductor epitaxial wafer further includes a plurality of device regions. The plurality of device regions each includes a body region of a second conductivity type in contact with the semiconductor layer, and a source region of the first conductivity type in contact with the body region. In step (B), a channel layer is formed so as to be in contact with at least a part of the body region by epitaxial growth of a semiconductor on a surface of the semiconductor layer. In step (C), a gate insulation film is formed on the channel layer. The channel layer contains the first conductivity type impurity at a concentration ranging from $1\times10^{18}$ cm$^{-3}$ to $1\times10^{19}$ cm$^{-3}$, inclusive, and has a thickness ranging from 10 nm to 100 nm, inclusive. In steps (B) and (C), a condition for the epitaxial growth and a condition for forming the gate insulation film are controlled so that, in a plane parallel to the main surface of the semiconductor wafer, a thickness distribution in the channel layer and a thickness distribution in the gate insulation film are positively correlated to each other.

The semiconductor wafer is a silicon carbide wafer, for example, the semiconductor layer is a silicon carbide semiconductor layer, for example, and the channel layer is constituted by a silicon carbide semiconductor, for example.

(First Exemplary Embodiment)

A semiconductor epitaxial wafer and a semiconductor device according to a first exemplary embodiment will now be described herein with reference to the accompanying drawings, as well as with reference to a silicon carbide epitaxial wafer and a silicon carbide semiconductor device (MISFET) as examples. The MISFET described herein, as an example, has an n-type conductivity type as a first conductivity type and a p-type conductivity type as a second conductivity type. A silicon carbide semiconductor device according to the exemplary embodiment may be a MISFET having a p-type conductivity type as a first conductivity type and an n-type conductivity type as a second conductivity type.

FIG. 1 is a plan view illustrating silicon carbide epitaxial wafer 300 according to the exemplary embodiment. Silicon carbide epitaxial wafer 300 includes first conductivity type silicon carbide wafer 301 and a silicon carbide semiconductor layer (not shown) disposed on silicon carbide wafer 301. The silicon carbide semiconductor layer may be an epitaxial layer. Silicon carbide wafer 301 may have a diameter of three inches or more, for example. Silicon carbide epitaxial wafer 300 includes a plurality of device regions Rc that are arranged in a two dimension manner. On each of device regions Rc, silicon carbide semiconductor device 200 is wholly or partially formed. When silicon carbide semiconductor device 200 is only partially formed, at least a channel layer constituted by a silicon carbide semiconductor may be formed.

Figure 2:
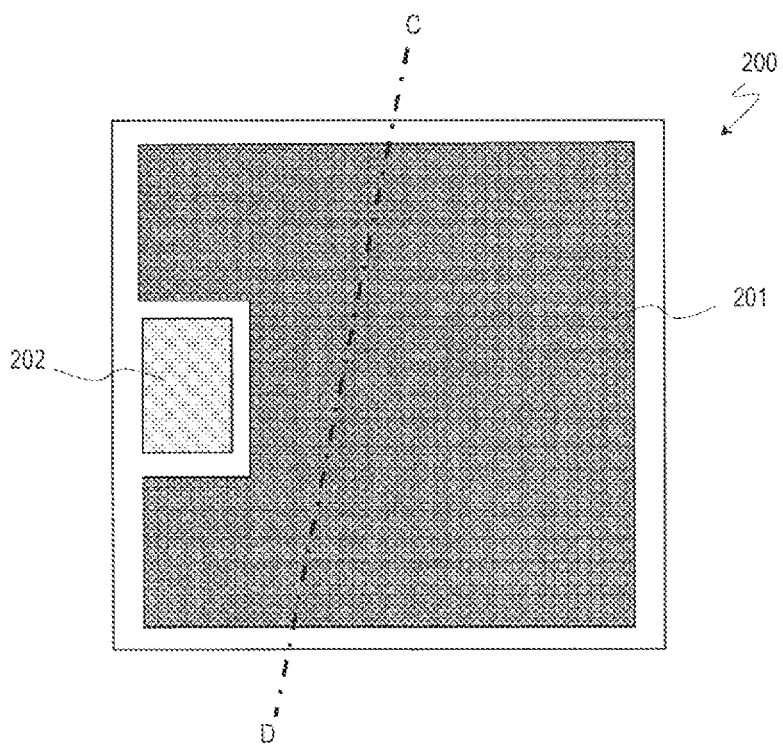
FIG. 2 is a plan view illustrating a silicon carbide semiconductor device.

FIG. 2 is a plan view illustrating silicon carbide semiconductor device 200. Silicon carbide semiconductor device 200 includes a plurality of unit cells (not shown) arranged in a two dimension manner. On silicon carbide semiconductor device 200, i.e., on a main surface of silicon carbide wafer 301, source pad 201 and gate pad 202 are provided over the plurality of unit cells. Source pad 201 and gate pad 202 are insulated from each other. In the specification, a region onto which a unit cell is to be formed in silicon carbide semiconductor device 200 is sometimes referred to as "unit cell forming region Ru."

Figure 3A:
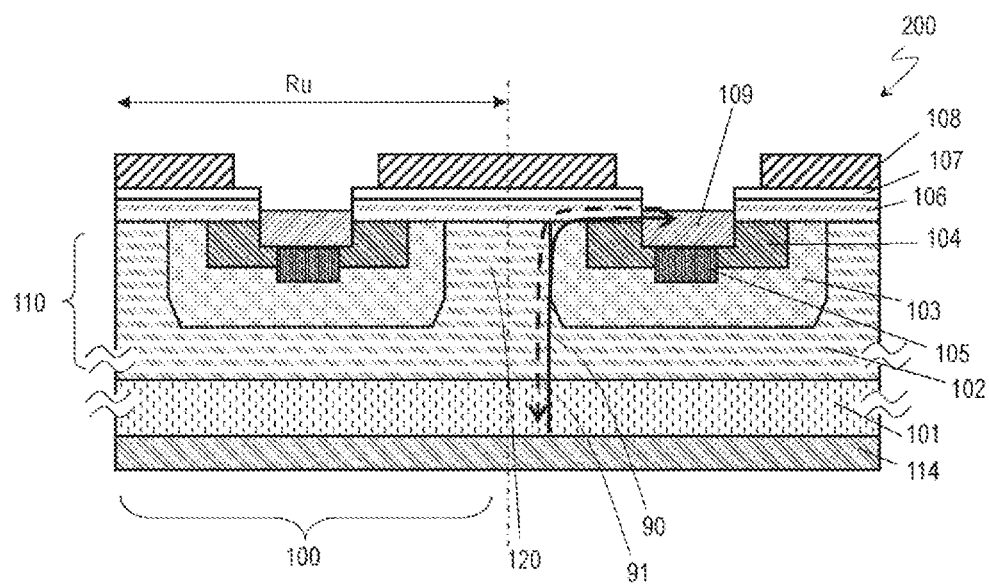
FIG. 3A is a cross-sectional view illustrating unit cells in the silicon carbide semiconductor device.

FIG. 3A is a cross-sectional view illustrating two unit cells 100 in silicon carbide semiconductor device 200.

Each of unit cells 100 includes first conductivity type silicon carbide semiconductor substrate (hereinafter simply referred to as "silicon carbide substrate") 101, and silicon carbide epitaxial layer (drift layer) 110 disposed on a main surface of silicon carbide substrate 101.

Silicon carbide substrate 101 is a part of silicon carbide wafer 301. Silicon carbide substrate 101 is an n$^+$ substrate (n$^+$ SiC substrate), for example.

On silicon carbide epitaxial layer 110, second conductivity type body region (well region) 103 is disposed. In silicon carbide epitaxial layer 110, a region in which body region 103 is not disposed is first conductivity type drift region 102. In a surface portion of drift region 102, region 120 lying between two adjacent body regions 103 functions as a junction field effect transistor (JFET) region. In the exemplary embodiment, drift region 102 is n-type, while body region 103 is p-type. An impurity concentration in drift region 102 and a thickness of drift region 102 are appropriately changed in accordance with a withstand voltage required for a semiconductor device.

In the exemplary embodiment, the first conductivity type is n-type, while the second conductivity type is p-type. However, n-type and p-type may be reversed from each other. The attached superscript "+" or "−", such as a symbol of "n$^+$" or "n$^-$", represents a relative concentration of a dopant. The symbol "n$^+$" indicates that an n-type impurity concentration is higher than an n-type impurity concentration indicated by a symbol "n", while the symbol "n$^-$" indicates that an n-type impurity concentration is lower than an n-type impurity concentration indicated by the symbol "n".

In body region 103, first conductivity type (n$^+$-type in here) source region 104 is disposed. In body region 103, second conductivity type (p$^+$-type in here) contact region 105 is further disposed. Contact region 105 is formed to reduce a contact resistance between body region 103 and source electrode 109. Contact region 105 may not be formed. In this case, a part of body region 103 is configured to be in direct contact with source electrode 109.

On source region 104, source electrode 109 is provided. Source electrode 109 electrically is in contact with both n$^+$-type source region 104 and p$^+$-type contact region 105. In the illustrated example, source electrode 109 is in contact with channel layer 106. However, source electrode 109 may not be in contact with channel layer 106.

On silicon carbide epitaxial layer 110, channel layer 106 is formed so as to be in contact with body region 103. Channel layer 106 is mainly made of a silicon carbide semiconductor, and contains a first conductivity type impurity. Channel layer 106 is formed so as to connect between source region 104 and JFET region 120. Channel layer 106 is formed through epitaxial growth on silicon carbide epitaxial layer 110, for example. In channel layer 106, a portion that lies between body region 103 and gate electrode 108, which is in contact with body region 103, functions as a channel region.

Gate insulation film 107 is disposed on channel layer 106. A thickness of gate insulation film 107 is appropriately selected so as to conform to a voltage to be applied to gate electrode 108. Gate electrode 108 is provided on gate insulation film 107. Gate electrode 108 is disposed so as to cover at least a portion, which lies between JFET region 120 and source region 104, of a surface of body region 103.

A plurality of unit cells 100 are electrically connected with each other by gate electrode 108 integrally formed, for example. Gate electrode 108 is electrically connected to gate pad 202 illustrated in FIG. 2. Although not shown in the drawings, a source wiring is provided on source electrode 109. With the source wiring provided on source electrode 109, the plurality of unit cells 100 are electrically connected with each other. The source wiring is electrically connected to source pad 201 illustrated in FIG. 2. On the other hand, drain electrode 114 is disposed on a back surface of silicon carbide substrate 101.

In silicon carbide semiconductor device 200, when an inequality of Vgs≥Vth is satisfied wherein a potential of gate electrode 108 relative to a potential of source electrode 109 is represented by Vgs and a gate threshold voltage is represented by Vth, a current flows in the forward direction (transistor ON mode). In here, an ON-current flows along a direction indicated by arrow 90 from drain electrode 114, via channel layer 106, to source electrode 109. On the other hand, when an inequality of 0(V)≤Vgs<Vth is satisfied, no current flows in the forward direction (transistor OFF mode). In the transistor OFF mode, a function of a channel diode is achieved. The channel diode allows a current to flow in the reverse direction when an inequality of Vds<0 (V) is satisfied. In here, the channel diode allows a current to flow along a direction indicated by arrow 91 from source electrode 109, via channel layer 106, to drain electrode 114.

<Relationship Between Thickness Distribution in Channel Layer 106 and Impurity Concentration Distribution in Channel Layer 106>

In the exemplary embodiment, within a surface of silicon carbide wafer 301 or within a surface of silicon carbide substrate 101 in silicon carbide semiconductor device 200, a thickness distribution in channel layer 106 and a concentration distribution of the first conductivity type impurity in channel layer 106 are negatively correlated to each other. The term "negatively correlated to each other" herein denotes a case in which, defining two points "a" and "b" at which channel layer 106 has different thicknesses in a plane parallel to silicon carbide wafer 301 or silicon carbide substrate 101, an equality of Ca<Cb is satisfied when an equality of Da>Db is satisfied or an equality of Ca>Cb is satisfied when an equality of Da<Db is satisfied, wherein the thicknesses of channel layer 106 at points "a" and "b" are respectively represented by Da and Db and concentrations of the first conductivity type impurity in channel layer 106 are respectively represented by Ca and Cb, for example.

When channel layer 106 has a multilayered structure, a thickness distribution in whole channel layer 106 and an impurity concentration distribution in a layer with a highest impurity concentration (highly concentrated impurity layer) in channel layer 106 may be negatively correlated to each other. When channel layer 106 includes both an n-type impurity and a p-type impurity, an absolute value of a difference between concentrations of the n-type and p-type impurities is referred to as an effective impurity concentration in channel layer 106. In this case, a thickness distribution in channel layer 106 and a distribution of an effective concentration of the first conductivity type impurity in channel layer 106 may be negatively correlated to each other.

Figure 4A:
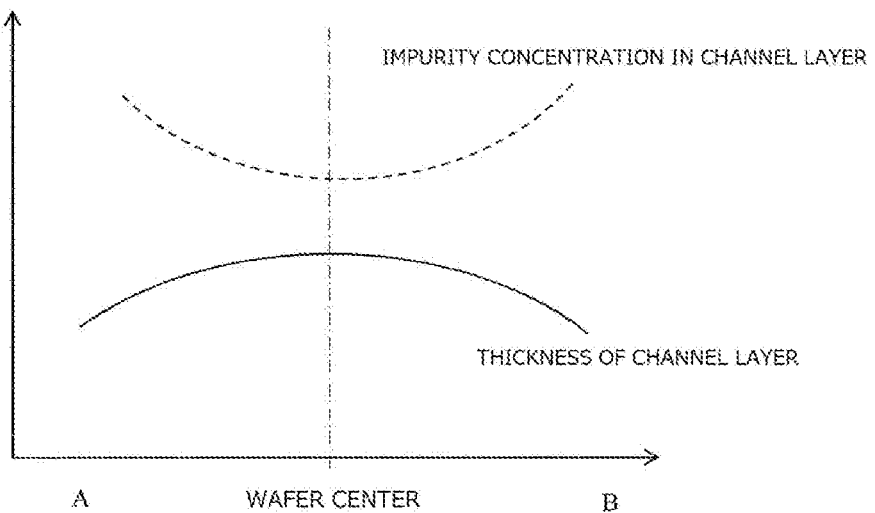
FIG. 4A is a graph illustrating a thickness distribution and an impurity concentration distribution in a channel layer, in a cross-section that passes through a center of the silicon carbide epitaxial wafer.
Figure 4B:
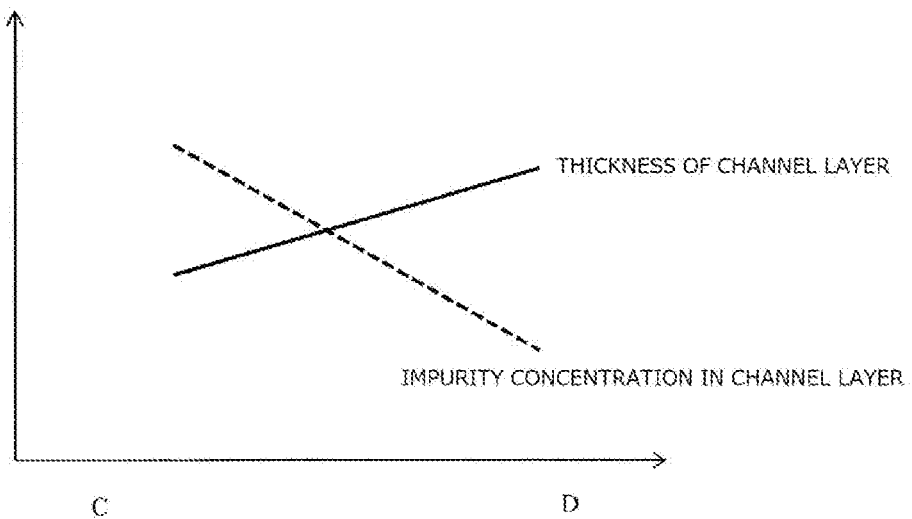
FIG. 4B is a graph illustrating a thickness distribution and an impurity concentration distribution in the channel layer, in a cross-section of the silicon carbide semiconductor device.

FIG. 4A is a graph illustrating a thickness distribution and an impurity concentration distribution in the channel layer, at a line that passes through a center of silicon carbide epitaxial wafer 300 (e.g., line A-B in FIG. 1). FIG. 4B is a graph illustrating a thickness distribution and an impurity concentration distribution in the channel layer, at a line that crosses silicon carbide semiconductor device 200 (e.g., line C-D in FIG. 2).

As illustrated in FIG. 4A, within the surface of silicon carbide wafer 301, channel layer 106 may have a concentric thickness distribution, in which a thickness in a center portion is greater than a thickness in a peripheral portion, as well as channel layer 106 may have a concentric impurity concentration distribution, in which an impurity concentration in the center portion is lower than an impurity concentration in the peripheral portion. Although not shown in the drawings, within the surface of silicon carbide wafer 301, channel layer 106 may have a concentric thickness distribution, in which a thickness in the center portion is smaller than a thickness in the peripheral portion, as well as channel layer 106 may have a concentric impurity concentration distribution, in which an impurity concentration in the center portion is greater than an impurity concentration in the peripheral portion. In channel layer 106, a thickness distribution and an impurity concentration distribution may not be concentric. Within the surface of silicon carbide wafer 301, at least one direction toward which a thickness distribution and an impurity concentration distribution in channel layer 106 are negatively correlated to each other may otherwise be present. For example, although not shown in the drawings, channel layer 106 may have a distribution in which an impurity concentration increases from an end, i.e., end A, to another end, i.e., end B, as well as channel layer 106 may have a distribution in which a thickness increases from end B to end A.

Similarly, in silicon carbide semiconductor device 200, within the surface of silicon carbide substrate 101, at least one direction toward which a thickness distribution and an impurity concentration distribution in channel layer 106 are negatively correlated to each other may be present. For example, as illustrated in FIG. 4B, channel layer 106 may have a distribution in which a thickness increases from an end, i.e., end C, to another end, i.e., end D, as well as channel layer 106 may have a distribution in which an impurity concentration increases from end D to end C.

When a thickness of channel layer 106 becomes small, gate threshold voltage Vth increases. When an impurity concentration in channel layer 106 becomes high, gate threshold voltage Vth decreases. When an impurity concentration at one of two points "a" and "b", whichever is thinner in thickness, is increased, an amount of variation in gate threshold voltage Vth due to a variation in thickness between two points "a" and "b" is therefore compensated by an amount of variation due to a variation in impurity concentration between two points "a" and "b." As a result, a difference (absolute value) in gate threshold voltage Vth between two points "a" and "b" can be reduced.

In silicon carbide epitaxial wafer 300 or silicon carbide semiconductor device 200 according to the exemplary embodiment as described above, an amount of variation in gate threshold voltage Vth due to a thickness distribution in channel layer 106 and an amount of variation in gate threshold voltage Vth due to an impurity concentration distribution in channel layer 106 can be compensated each other. Variations in device characteristics due to variations in other factors within the surface of channel layer 106 can thus be reduced, improving a yield rate. Under a "compensation" in here, an amount of variation in gate threshold voltage Vth due to a thickness distribution in channel layer 106 and an amount of variation in gate threshold voltage Vth due to an impurity concentration distribution in channel layer 106 may not fully cancel out each other. Between such parameters, an amount of variation in gate threshold voltage Vth may compensate another amount of variation in gate threshold voltage Vth so that a total variation in gate threshold voltage Vth can be reduced, as a result.

A thickness of and an impurity concentration in channel layer 106 may advantageously be controlled so that silicon carbide semiconductor device 200 can function as a channel diode. In this case, an impurity concentration in channel layer 106 is set relatively higher, greatly affecting gate threshold voltage Vth. Compensating an amount of variation in gate threshold voltage Vth at this time can therefore result in a significant effect.

In an ordinary MISFET in which no channel diode is present, an impurity concentration in a channel layer is below an order of approximately $10^{17}$ cm$^{-3}$, and a variation in gate threshold voltage Vth due to a variation in another factor within a surface of the channel layer would be less likely to be problematic. For example, Unexamined Japanese Patent Publication No. 2012-94648 discloses a method of reducing a variation in gate threshold voltage Vth due to an impurity distribution in a body region. The disclosure does not however address a variation in gate threshold voltage Vth due to a variation within a surface of a channel layer. The disclosure does not obviously address how a thickness and an impurity concentration in the channel layer are correlated to each other. On the other hand, in the exemplary embodiment of the present application, due to its higher impurity concentration in the channel layer, a variation in gate threshold voltage Vth due to an impurity concentration distribution in the channel layer is greater than a variation in gate threshold voltage Vth due to an impurity concentration distribution in the body region. By allowing variations in gate threshold voltage Vth due to variations in thickness and impurity concentration in the channel layer to compensate each other, a silicon carbide semiconductor device in which a variation in gate threshold voltage Vth is reduced can be achieved.

<Structure of Channel Layer 106>

Channel layer 106 may be a single n-type or p-type impurity layer. When channel layer 106 is a single impurity layer, a concentration of a first conductivity type impurity in channel layer 106 may range from $1\times10^{18}$ cm$^{-3}$ to $1\times10^{19}$ cm$^{-3}$, inclusive, and a thickness may range from 10 nm to 100 nm, inclusive, for example.

Channel layer 106 may have a multilayered structure. In this case, channel layer 106 may be structured so that an n-type or p-type impurity layer (hereinafter referred to as "high concentration impurity layer") and a low concentration impurity layer containing an impurity at a concentration lower than a concentration of the impurity in the high concentration impurity layer are multilayered. A concentration of the first conductivity type impurity in the high concentration impurity layer may range from $1\times10^{18}$ cm$^{-3}$ to $1\times10^{19}$ cm$^{-3}$, inclusive, for example. A "low concentration impurity layer" may be an undoped layer containing substantially no impurity. When channel layer 106 has a multilayered structure, an in-plane impurity concentration distribution in a high concentration impurity layer and an in-plane thickness distribution in whole channel layer 106 may be negatively correlated to each other.

Figure 3B:
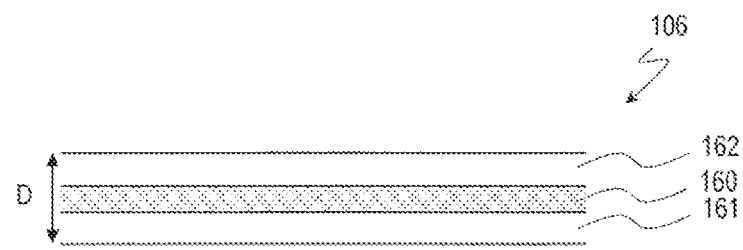
FIG. 3B is an enlarged cross-sectional view of an example of a channel layer.

FIG. 3B is an enlarged cross-sectional view of an example of channel layer 106. Channel layer 106 may have a multilayered structure including bottom layer 161, n-type high concentration impurity layer 160, and cap layer 162, which are laminated in this order from a side near silicon carbide substrate 101. Here, bottom layer 161 is an n-type, low concentration impurity layer or undoped layer, and cap layer 162 is an n-type, low concentration impurity layer or undoped layer, for example. Bottom layer 161 may have a thickness ranging from 5 nm to 40 nm, inclusive. High concentration impurity layer 160 may have a thickness ranging from 10 nm to 40 nm, inclusive. Cap layer 162 may have a thickness ranging from 5 nm to 40 nm, inclusive. Total thickness D of the layers may range from 20 nm to 100 nm, inclusive, for example. A concentration of an n-type impurity in bottom layer 161 may be below $1\times10^{18}$ cm$^{-3}$. A concentration of the n-type impurity in high concentration impurity layer 160 may range approximately from $1\times10^{18}$ cm$^{-3}$ to $1\times10^{19}$ cm$^{-3}$, inclusive. A concentration of the n-type impurity in cap layer 162 may be below $1\times10^{18}$ cm$^{-3}$. Impurity concentrations in the layers may not be always even, but may be unevenly distributed in thickness directions of the layers.

Providing cap layer 162 offers benefits as described below. In a production step such as sacrificial oxidation and gate oxidation, channel layer 106 might become thinner. At this time, in channel layer 106 without having a cap layer, high concentration impurity layer 160 becomes thinner in thickness, and a variation in thickness can thus cause variations in electrical properties including a gate threshold voltage in the forward direction and a rising voltage in the reverse direction. On the other hand, by forming a low concentration impurity layer, i.e., cap layer 162, on a surface of high concentration impurity layer 160, high concentration impurity layer 160, which has high Vth-sensitivity, can be prevented from becoming thinner, so that variations in electrical properties of a MISFET can be reduced.

Providing bottom layer 161 offers benefits as described below. When channel layer 106 is allowed to epitaxially grow, its growth rate and impurity concentration might become unstable in an initial growth stage. On the other hand, by not allowing a dopant gas to flow in the initial growth stage, an undoped layer or a low concentration impurity layer including only background nitrogen is allowed to grow as bottom layer 161, and then, after a growth rate becomes stable, high concentration impurity layer 160 is allowed to grow. Thus, a variation in impurity concentration due to the unstable growth rate in the initial growth stage can be reduced.

FIG. 3B illustrates channel layer 106 having a three-layer structure. Alternatively, channel layer 106 may have a two-layer structure including bottom layer 161 and high concentration impurity layer 160 or high concentration impurity layer 160 and cap layer 162. Channel layer 106 may otherwise have a multilayered structure with four or more layers.

<Relationship Between Thickness Distribution in Channel Layer 106 and Thickness Distribution in Gate Insulation Film 107>

In addition to or instead of a correlation (negative correlation) between a thickness distribution and an impurity concentration distribution in channel layer 106, the thickness distribution in channel layer 106 and a thickness distribution in gate insulation film 107 may be positively correlated to each other, within the surface of silicon carbide wafer 301 or within the surface of silicon carbide substrate 101 in silicon carbide semiconductor device 200. The term "positively correlated to each other" herein denotes a case in which, defining two points "a" and "b" at which channel layer 106 has different thicknesses in a plane parallel to silicon carbide wafer 301 or silicon carbide substrate 101, an equality of Ta>Tb is satisfied when an equality of Da>Db is satisfied or an equality of Ta<Tb is satisfied when an equality of Da<Db is satisfied, wherein the thicknesses of channel layer 106 at points "a" and "b" are respectively represented by Da and Db and thicknesses of gate insulation film 107 at points "a" and "b" are respectively represented by Ta and Tb, for example.

When gate insulation film 107 is a thermal oxide film that is formed by thermal oxidizing a surface region of channel layer 106, channel layer 106 may be formed so as to satisfy the above described correlation by considering reduction of channel layer 106 in the surface region through the thermal oxidation.

Figure 5A:
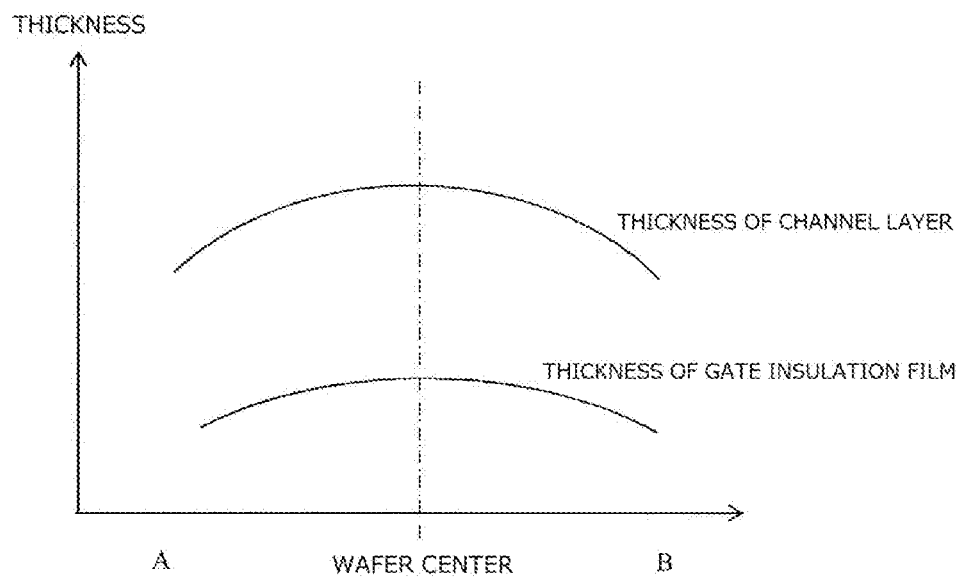
FIG. 5A is a graph illustrating a thickness distribution in the channel layer and a thickness distribution in a gate insulation film, in a cross-section that passes through the center of the silicon carbide epitaxial wafer.
Figure 5B:
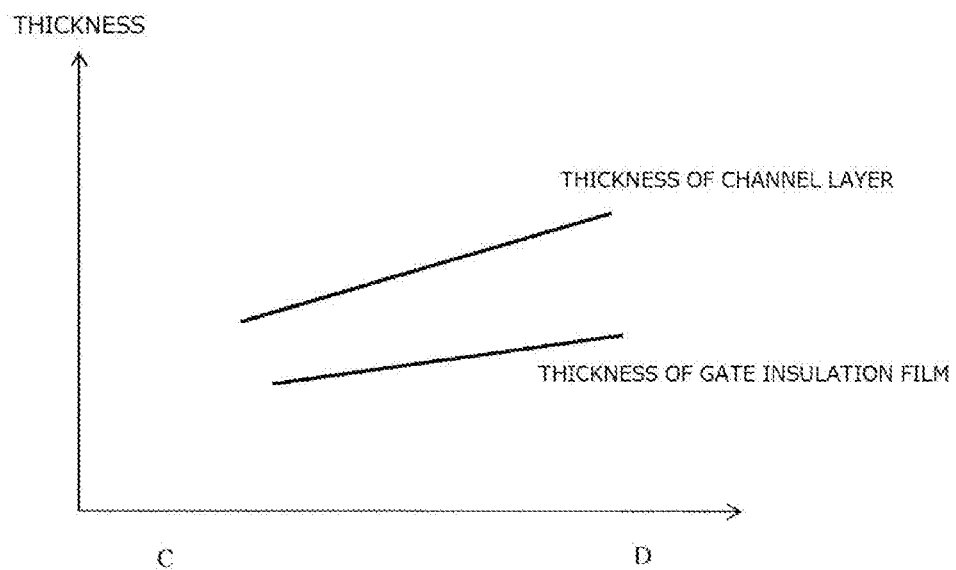
FIG. 5B is a graph illustrating a thickness distribution in the channel layer and a thickness distribution in the gate insulation film, in a cross-section of the silicon carbide semiconductor device.

FIG. 5A is a graph illustrating a thickness distribution in channel layer 106 and a thickness distribution in gate insulation film 107, at the line that passes through a center of silicon carbide epitaxial wafer 300 (e.g., line A-B in FIG. 1). FIG. 5B is a graph illustrating a thickness distribution in channel layer 106 and a thickness distribution in gate insulation film 107, at the line that crosses silicon carbide semiconductor device 200 (e.g., line C-D in FIG. 2).

As illustrated in FIG. 5A, within the surface of silicon carbide wafer 301, channel layer 106 and gate insulation film 107 may each have a concentric thickness distribution, in which a thickness in the center portion is greater than a thickness in the peripheral portion. Although not shown in the drawings, within the surface of silicon carbide wafer 301, channel layer 106 and gate insulation film 107 may have a concentric thickness distribution, in which a thickness in the center portion is smaller than the thickness in a peripheral portion. A thickness distribution may not be concentric. Within the surface of silicon carbide wafer 301, at least one direction toward which a thickness distribution in channel layer 106 and a thickness distribution in gate insulation film 107 are positively correlated to each other may be present.

Similarly, in silicon carbide semiconductor device 200, as illustrated in FIG. 5B, within the surface of silicon carbide substrate 101, at least one direction toward which a thickness distribution in channel layer 106 and a thickness distribution in gate insulation film 107 are positively correlated to each other may be present.

In silicon carbide epitaxial wafer 300 or silicon carbide semiconductor device 200 according to the exemplary embodiment, an amount of variation in gate threshold voltage Vth due to a thickness distribution in channel layer 106 and an amount of variation in gate threshold voltage Vth due to a thickness distribution in gate insulation film 107 compensate each other. Variations in device characteristics due to variations in other factors within the surface of channel layer 106 can thus be reduced.

Figure 6A:
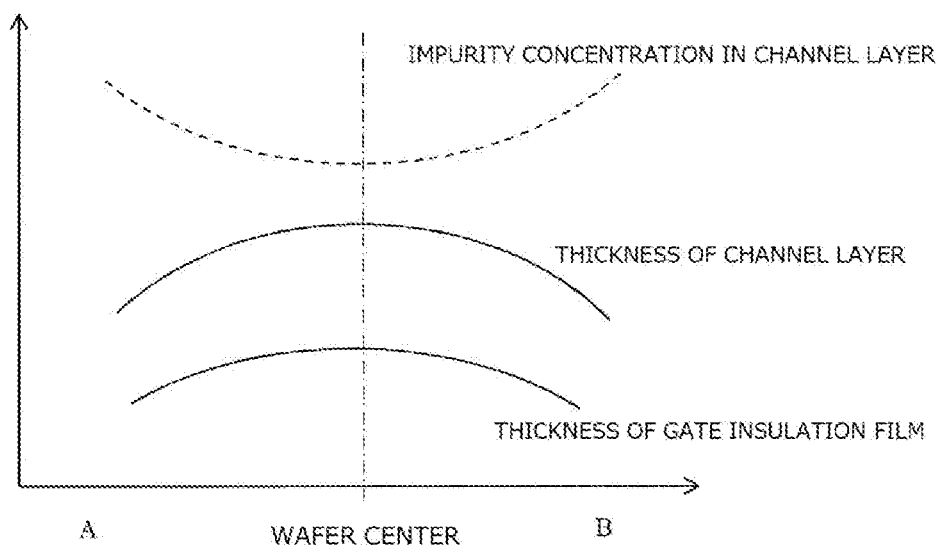
FIG. 6A is a graph illustrating the thickness distribution in the channel layer, an impurity concentration distribution in the channel layer, and the thickness distribution in the gate insulation film, in a cross-section that passes through the center of the silicon carbide epitaxial wafer.
Figure 6B:
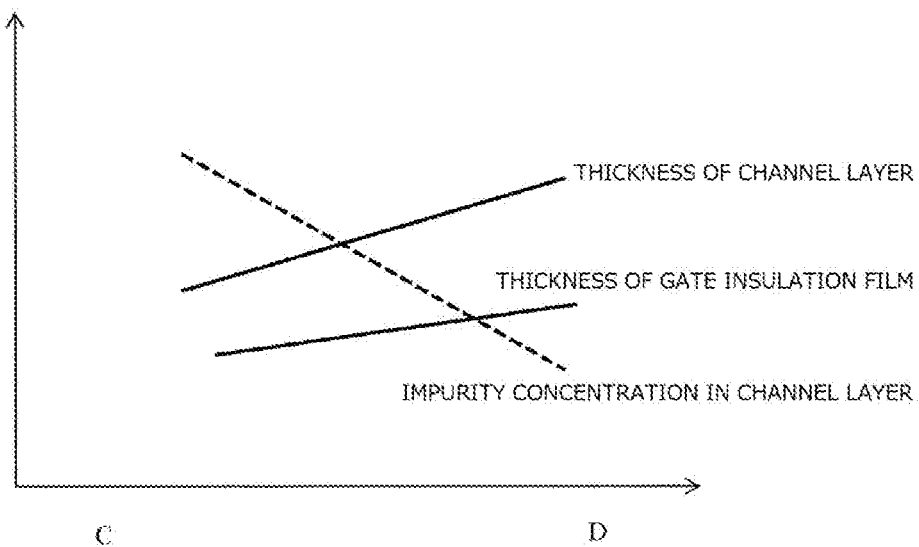
FIG. 6B a graph illustrating the thickness distribution in the channel layer, an impurity concentration distribution in the channel layer, and the thickness distribution in the gate insulation film, in a cross-section of the silicon carbide semiconductor device.

As illustrated in FIG. 6A, within the surface of silicon carbide wafer 301, a thickness distribution in channel layer 106 and an impurity concentration distribution in channel layer 106 may be negatively correlated to each other, as well as a thickness distribution in channel layer 106 and a thickness distribution in gate insulation film 107 may be positively correlated to each other. Similarly, as illustrated in FIG. 6B, within the surface of silicon carbide substrate 101, a thickness distribution in channel layer 106 and an impurity concentration distribution in channel layer 106 may be negatively correlated to each other, as well as a thickness distribution in channel layer 106 and a thickness distribution in gate insulation film 107 may be positively correlated to each other. Therefore, a variation in gate threshold voltage Vth within the surface of silicon carbide wafer 301 or silicon carbide substrate 101 can be effectively reduced.

(Amount of Variation Occurring in Steps for Producing MISFET and Sensitivity to Gate Threshold Voltage Vth)

The inventor of the present disclosure has estimated how degree gate threshold voltage Vth will be affected by an amount of variation occurring in steps for producing a MISFET. The estimation result will now be described herein.

In production steps of a MISFET, a thickness of channel layer 106, an impurity concentration in channel layer 106, a thickness of gate insulation film 107, an impurity concentration in body region 103, and channel length L could vary within the surface of silicon carbide epitaxial wafer 300, for example. Such variations could cause gate threshold voltage Vth to vary. For these factors, an amount of variation and sensitivity to gate threshold voltage Vth (Vth sensitivity) are calculated. Results are shown in Table 1. The term "Vth sensitivity" herein denotes an amount of change in a positive or negative direction of gate threshold voltage Vth with respect to a unit amount of variation. For example, Vth sensitivity to a thickness of channel layer 106 is −0.15 V. This means that, when a thickness of channel layer 106 increases (or decreases) by 1 nm, for example, gate threshold voltage Vth changes by 0.15 V in the negative direction, i.e., decreases (or increases) by 0.15 V. By using the amount of variation and the Vth sensitivity, amounts of variations in gate threshold voltage Vth due to factors and a total of the amounts of variations in gate threshold voltage Vth due to the factors (total amount of variation in Vth) are obtained and shown in Table 1.

As can be understood from Table 1, main factors that have caused gate threshold voltage Vth to vary are a varied thickness of channel layer 106, a varied impurity concentration in channel layer 106, and a varied thickness of gate insulation film 107. By allowing the amounts of variations in gate threshold voltage Vth due to the factors to compensate each other, a total amount of variation in Vth can be significantly reduced.

For example, by allowing an amount of variation in gate threshold voltage Vth due to a varied thickness of channel layer 106 to be compensated with an amount of variation in gate threshold voltage Vth due to a varied impurity concentration in channel layer 106, a total amount of variation in Vth can be reduced from ±1.1 V to ±0.5 V, as illustrated in Table 1.

A thickness distribution in gate insulation film 107 may further be controlled so as to be positively correlated to a thickness distribution in channel layer 106. An amount of variation in gate threshold voltage Vth due to a varied thickness of channel layer 106 can therefore be compensated with an amount of variation in gate threshold voltage Vth due to a varied impurity concentration in channel layer 106 and a varied thickness of gate insulation film 107. As illustrated in Table 1, the total amount of variation in Vth can therefore be reduced to ±0.35 V.

According to a result of the estimation, it can be confirmed that a total amount of variation in Vth is reduced by controlling a distribution of a varied thickness or concentration amount that could occur in steps for producing.

TABLE 1

| | Amount of variation | Sensitivity to Vth | Amount of variation in Vth |
|---|---|---|---|
| Thickness of channel layer | ±4 nm | −0.15 V/nm | ±0.60 V |
| Impurity concentration in channel layer | ±3 × $10^{17}$ $cm^{-3}$ | −1 × $10^{-18}$ $V/cm^{-3}$ | ±0.30 V |
| Thickness of gate insulation film | ±3 nm | 0.05 V/nm | ±0.15 V |
| Impurity concentration in body region | ±6 × $10^{17}$ $cm^{-3}$ | 5.8 × $10^{-20}$ $V/cm^{-3}$ | ±0.035 V |
| Channel length | ±0.05 μm | 0.06 V/μm | ±0.003 V |
| Total amount of variation in Vth | | | ±1.1 V |
| Total amount of variation in Vth when amounts of variation in Vth in thickness of and impurity concentration in channel layer are compensated | | | ±0.5 V |
| Total amount of variation in Vth when amounts of variations in Vth in thickness of and impurity concentration in channel layer and thickness of gate insulation film are compensated | | | ±0.35 V |

<Method of Producing Silicon Carbide Semiconductor Devices 200>

Next, a method of producing silicon carbide semiconductor devices 200, according to the exemplary embodiment, will now be described herein with reference to the accompanying drawings.

Figure 7A:
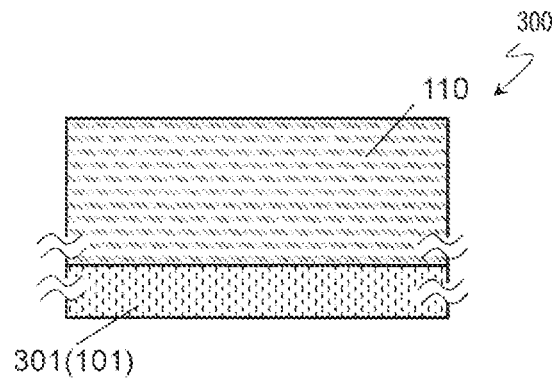
FIG. 7A is a cross-sectional view for explaining a method of producing the silicon carbide semiconductor devices.

FIGS. 7A to 7F are cross-sectional views explaining the method of producing silicon carbide semiconductor devices 200, respectively. FIG. 7A illustrates a part of silicon carbide epitaxial wafer 300. FIGS. 7B to 7F illustrate single unit cell forming region Ru in silicon carbide epitaxial wafer 300, respectively.

Firstly, as illustrated in FIG. 7A, first conductivity type (n-type) silicon carbide epitaxial layer 110 is allowed to epitaxially grow on the main surface of silicon carbide wafer 301 to obtain silicon carbide epitaxial wafer 300.

As silicon carbide wafer 301, for example, an off-cut substrate in which a 4H—SiC (0001) surface is shifted four degrees in a [11-20] direction is used. Silicon carbide wafer 301 has a diameter of 75 mm, for example. Silicon carbide wafer 301 is n-type. Silicon carbide wafer 301 has an impurity concentration ranging approximately from 5×$10^{18}$ $cm^{-3}$ to 1×$10^{19}$ $cm^{-3}$, inclusive, for example.

Before allowing silicon carbide epitaxial layer 110 to epitaxially grow in a forming process, silicon carbide wafer 301 is heated. In this heating process, no source gas is supplied, but silicon carbide wafer 301 is heated under an atmosphere filled with at least hydrogen. At the time when silicon carbide wafer 301 is heated to a predetermined growth temperature (wafer temperature, 1600° C. in here), a source gas and a dopant gas of nitrogen are supplied. As described above, silicon carbide epitaxial layer 110 is formed on the main surface of silicon carbide wafer 301 in a thickness ranging approximately from 5 µm to 100 µm, inclusive (e.g., 10 µm), for example. Silicon carbide epitaxial layer 110 has an n-type impurity concentration ranging from $1\times10^{14}$ cm$^{-3}$ to $1\times10^{17}$ cm$^{-3}$, inclusive (e.g., $1\times10^{16}$ cm$^{-3}$), for example, which is set lower than an n-type impurity concentration in silicon carbide wafer 301.

Figure 7B:
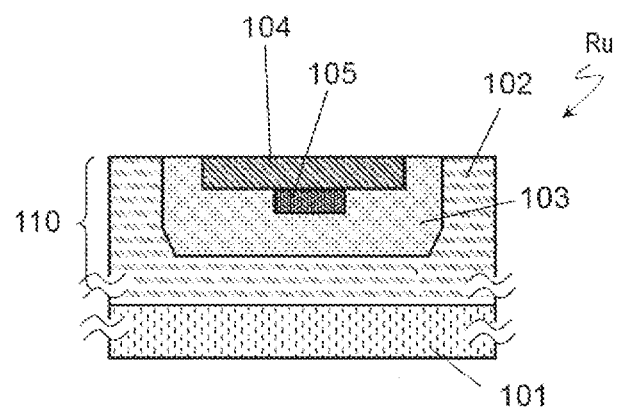
FIG. 7B is a cross-sectional view for explaining the method of producing the silicon carbide semiconductor devices.

Next, as illustrated in FIG. 7B, within unit cell forming region Ru, p-type or n-type impurity ions are implanted into a selected region of silicon carbide epitaxial layer 110 to form body region 103, source region 104, and contact region 105.

Specifically, on silicon carbide epitaxial layer 110, a mask made of SiO$_2$ (not shown) is formed, for example, and then p-type impurity ions (e.g., Al ions or B ions) are implanted into a region where no mask is formed so as to form body region 103. Body region 103 has a width ranging from 5 µm to 10 µm, inclusive, for example. A concentration of a p-type impurity in body region 103 ranges from $1\times10^{17}$ cm$^{-3}$ to $1\times10^{20}$ cm$^{-3}$, inclusive, for example.

N-type impurity ions (e.g., nitrogen ions) are further implanted into contact region 105 so as to form source region 104. A concentration of an n-type impurity in source region 104 ranges from $1\times10^{18}$ cm$^{-3}$ to $1\times10^{21}$ cm$^{-3}$, inclusive, for example.

Within body region 103, p-type impurity ions are implanted so as to form contact region 105. A concentration of a p-type impurity in contact region 105 ranges from $1\times10^{19}$ cm$^{-3}$ to $1\times10^{21}$ cm$^{-3}$, inclusive, for example.

After the ions are implanted, the mask is removed, and then activating annealing is performed. For example, activation annealing is performed at a temperature of approximately 1700° C. under an inert atmosphere for approximately 30 minutes.

Figure 7C:
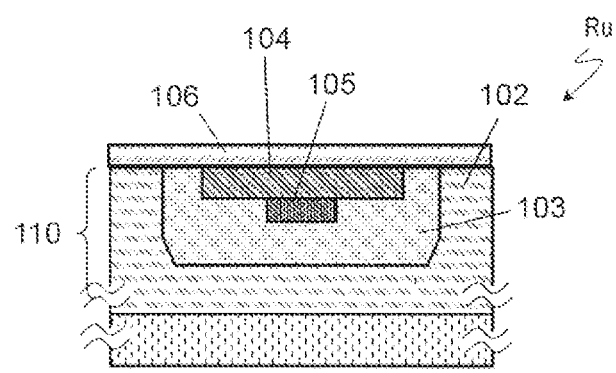
FIG. 7C is a cross-sectional view for explaining the method of producing the silicon carbide semiconductor devices.

Next, as illustrated in FIG. 7C, channel layer 106 is formed through epitaxial growth over the surface of silicon carbide epitaxial layer 110 including body region 103, source region 104, and contact region 105. In the exemplary embodiment, nitrogen is supplied as the dopant gas to form channel layer 106. An average concentration in channel layer 106 ranges approximately from $1\times10^{18}$ cm$^{-3}$ to $1\times10^{19}$ cm$^{-3}$, inclusive, for example. An average thickness of channel layer 106 ranges from 20 nm to 100 nm inclusive, for example.

In the exemplary embodiment, by controlling a condition for epitaxial growth for channel layer 106, channel layer 106 is intentionally caused to have a predetermined in-plane distribution in thickness and/or concentration. The condition for epitaxial growth includes parameters, such as amount of source gas to be supplied, supply rate of source gas, growth pressure, and growth temperature.

A thickness distribution in channel layer 106 can be controlled by a growth temperature, a growth pressure, and a gas flow amount, for example. For example, when a higher growth temperature is set (e.g., in a range more than 1500° C. and equal to or less than 1600° C.), a thickness of channel layer 106 can be made smaller in the center portion of silicon carbide wafer 301 than a thickness of channel layer 106 in the peripheral portion of silicon carbide wafer 301 (center portion<peripheral portion). On the other hand, when a lower growth temperature is set (e.g., in a range from 1400° C. to 1500° C., inclusive), a thickness of channel layer 106 can be made greater in the center portion of silicon carbide wafer 301 than a thickness of channel layer 106 in the peripheral portion of silicon carbide wafer 301 (center portion>peripheral portion). As an assumed mechanism of why a thickness distribution changes in channel layer 106 is that, when a growth temperature, a growth pressure, or a gas flow amount is changed, a temperature distribution or a gas flow rate changes in an epitaxial growth furnace, and a profile in which a source gas is thermally decomposed from upstream to downstream in the epitaxial growth furnace is thus further changed, for example. An impurity concentration distribution in channel layer 106 on a surface of a wafer can be controlled by changing a flow amount of a source gas and an atomic ratio between carbon and silicon contained in the source gas (C/Si ratio), as well as by changing a temperature distribution within the surface of the wafer, for example. For example, when a higher C/Si ratio is set (e.g., in a range from 1.6 to 2.2, inclusive), an impurity concentration in channel layer 106 in the center portion of silicon carbide wafer 301 can be made higher than an impurity concentration in channel layer 106 in the peripheral portion of silicon carbide wafer 301 (center portion>peripheral portion). On the other hand, when a lower C/Si ratio is set (e.g., in a range from 1.0 to 1.6, inclusive), an impurity concentration in channel layer 106 can be made lower in the center portion of silicon carbide wafer 301 than an impurity concentration in channel layer 106 in the peripheral portion of silicon carbide wafer 301 (center portion<peripheral portion). It is known, through experiments, that impurity concentration is highly susceptible to wafer temperature than film thickness. An impurity distribution is thus affected by a wafer temperature distribution. As an assumed mechanism of why an impurity distribution changes is that, when an effective C/Si ratio changes within a surface of a wafer due to a balance among a temperature distribution within the surface of the wafer, a flow amount of a source gas, and a C/Si ratio, an impurity concentration in a center portion becomes higher or lower than an impurity concentration in a peripheral portion.

Figure 7D:
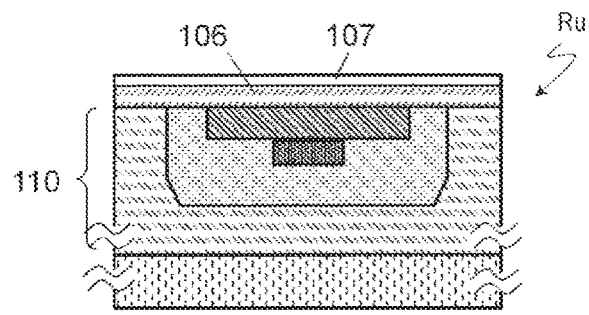
FIG. 7D is a cross-sectional view for explaining the method of producing the silicon carbide semiconductor devices.

Next, as illustrated in FIG. 7D, for example, a surface portion of channel layer 106 is thermally oxidized so as to form gate insulation film 107 on silicon carbide epitaxial layer 110. Gate insulation film 107 may be an oxide film, an oxynitride film, or a film multilayered with an oxide film and an oxynitride film. In here, as gate insulation film 107, for example, the surface of silicon carbide epitaxial layer 110 is thermally oxidized under a temperature ranging from 1100° C. to 1400° C., inclusive so as to form a thermal oxide (SiO$_2$) film. Gate insulation film 107 has a thickness ranging from 40 nm to 80 nm, inclusive, for example. Instead of a thermal oxide film, a SiO$_2$ film may be formed through a CVD method on silicon carbide epitaxial layer 110.

When a thermal oxide film is to be formed as gate insulation film 107, a thickness distribution in gate insulation film 107 can be controlled by using an oxygen concentration distribution around a wafer, for example. For example, in an oxidizing furnace for multiple charging, in which a plurality of wafers are arranged on a carrier for substrate so that two adjacent wafers face each other at a constant gap, when a gas (e.g., oxygen, nitrogen, or argon) is not fully supplied in amount, the gas flow stagnates. In this case, oxygen would be less likely to reach around a wafer center, meanwhile oxygen would be likely to reach around a wafer peripheral portion. Thus, an oxygen concentration lowers around the wafer center, resulting in thinner gate insulation film 107 in the wafer center (center portion<peripheral portion). On the other hand, when the gas is fully supplied in amount (e.g., oxygen, nitrogen, or argon), such an event that oxygen would be less likely to reach around the wafer center, as described above, can be suppressed. However, around the wafer peripheral portion, the oxygen is consumed by the carrier for substrate, resulting in thinner gate insulation film 107 in the wafer peripheral portion (center portion>peripheral portion). A thickness distribution in gate insulation film 107 can be controlled by changing a structure of a carrier onto which a wafer is placed so as to control a temperature distribution in a surface of a wafer.

Figure 7E:
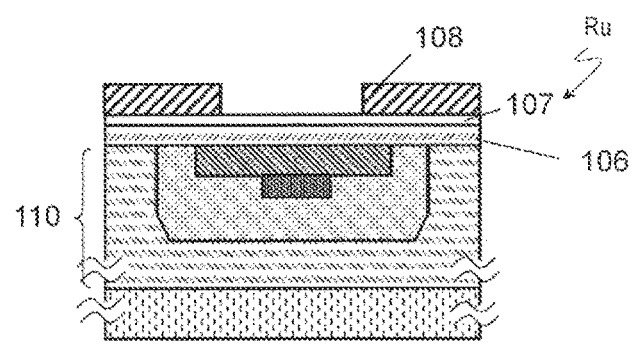
FIG. 7E is a cross-sectional view for explaining the method of producing the silicon carbide semiconductor devices.

Next, as illustrated in FIG. 7E, gate electrode 108 is formed on gate insulation film 107. Gate electrode 108 can be formed by using a low pressure chemical vapor deposition (LPCVD) apparatus to deposit polysilicon (poly-Si film) doped with phosphorus on gate insulation film 107, for example.

Figure 7F:
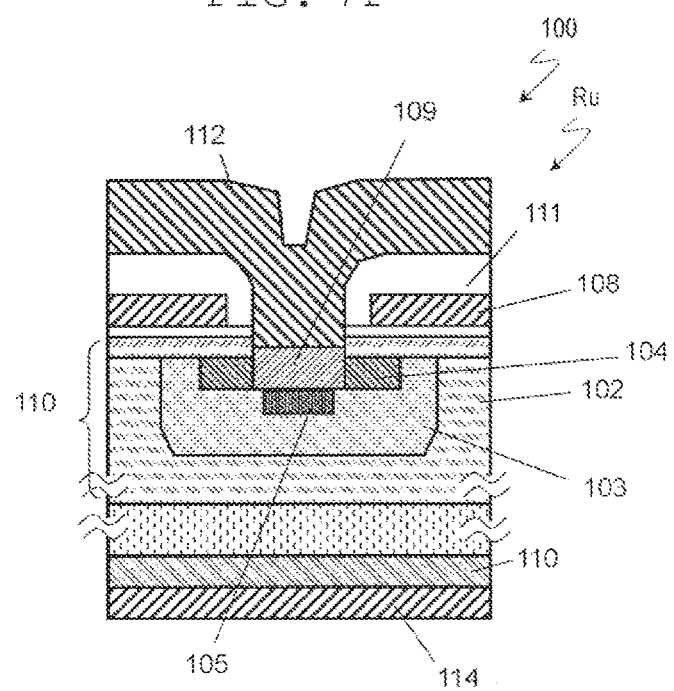
FIG. 7F is a cross-sectional view for explaining the method of producing the silicon carbide semiconductor devices.

Next, as illustrated in FIG. 7F, source electrode 109 and drain electrode 114 are formed.

Firstly, interlayer insulating layer 111 is allowed to deposit through the CVD method so as to cover gate electrode 108, for example. Interlayer insulating layer 111 may be made of $SiO_2$. After that, an opening for a source electrode is formed in interlayer insulating layer 111. Next, source electrode 109 is formed in the opening of interlayer insulating layer 111. In here, for example, a nickel film having a thickness ranging from approximately 50 m to approximately 100 nm inclusive is first formed in the opening, and then heat treatment is performed under an inert atmosphere for five minutes at a temperature of 950° C. so as to allow nickel and a surface of silicon carbide to react each other. Thus, source electrode 109 made of nickel silicide is formed. Source electrode 109 forms an ohmic contact with a part of source region 104 and contact region 105. Drain electrode 114 is formed on the back surface of silicon carbide substrate 101. For example, titanium is deposited to a thickness of approximately 150 nm on the back surface of silicon carbide substrate 101, and then, the heat treatment which is similar to the above is performed so as to allow the titanium and a surface of silicon carbide to react each other. Thus, drain electrode 114 made of titanium silicide is formed. Drain electrode 114 forms an ohmic contact with silicon carbide substrate 101. After that, on interlayer insulating layer 111 and in the opening of interlayer insulating layer 111, source wire 112 is formed so as to be in contact with source electrode 109 in the opening.

With the above described process, device structures including the plurality of unit cells 100 are formed in device regions of silicon carbide epitaxial wafer 300. Although not shown in the drawings, after that, silicon carbide epitaxial wafer 300 is cut into devices (chips). A plurality of silicon carbide semiconductor devices (MISFET) 200 can be therefore obtained.

In the exemplary embodiment, channel layer 106 is intentionally caused to have predetermined distributions in thickness and impurity concentration, as well as gate insulation film 107 is intentionally caused to have a predetermined distribution in thickness. A difference between a maximum value and a minimum value in each distribution of such parameters may be adjusted so that a variation in gate threshold voltage Vth can effectively be reduced.

Within the surface of silicon carbide wafer 301, a difference between a maximum value and a minimum value in the thickness distribution in channel layer 106 may range from 2 nm to 20 nm, inclusive, for example, while a difference between a maximum value and a minimum value in a concentration distribution of the first conductivity type impurity in channel layer 106 may range from $2 \times 10^{17}$ cm$^{-3}$ to $2 \times 10^{18}$ cm$^{-3}$, inclusive, for example. Therefore, a variation in Vth can further effectively be reduced. A thickness distribution, for example, in each of the device regions becomes smaller than the above described thickness distribution in whole silicon carbide wafer 301, for example. For example, within the surface of silicon carbide substrate 101, a difference between a maximum value and a minimum value in the thickness distribution in channel layer 106 may range from 1 nm to 5 nm, inclusive, while a difference between a maximum value and a minimum value in a concentration distribution of the first conductivity type impurity in channel layer 106 may range from $1 \times 10^{17}$ cm$^{-3}$ to $1 \times 10^{18}$ cm$^{-3}$, inclusive. Variations in gate threshold voltage Vth among unit cells in silicon carbide semiconductor device 200 can therefore be kept equal to or below ±0.5 V, for example. A difference between a maximum value and a minimum value in a thickness distribution in channel layer 106 may advantageously range from 1 nm to 2 nm, inclusive, while a difference between a maximum value and a minimum value in a concentration distribution of the first conductivity type impurity in channel layer 106 may advantageously range from $1 \times 10^{17}$ cm$^{-3}$ to $2 \times 10^{17}$ cm$^{-3}$, inclusive. Variations in gate threshold voltage Vth among unit cells in silicon carbide semiconductor device 200 can therefore be kept equal to or below ±0.3 V, for example.

(Example and Comparative Example)

MISFETs according to an example and a comparative example are produced, and variations in device characteristics within surfaces of silicon carbide wafers 301 are measured. The methods and results are described below.

As the example, a plurality of MISFETs are produced on silicon carbide wafer 301 having a diameter of 75 mm (3 inches). For the produced MISFETs, a p-type impurity concentration in body region 103 is set to $2 \times 10^{19}$ cm$^{-3}$, a thickness of gate insulation film 107 is set to 70 nm, and a channel length is set to 0.5 μm. As channel layer 106, a multilayered channel layer multilayered with a bottom layer, a high concentration impurity layer, and a cap layer in order from a substrate is formed. An average concentration of an n-type impurity in the high concentration impurity layer is set to $1.2 \times 10^{18}$ cm$^{-3}$, while a thickness is set to 20 nm. The bottom layer is set to be an undoped layer having a thickness of 17 nm, and the cap layer is set to be an undoped layer having a thickness of 20 nm. A total average thickness of the layers in channel layer 106 is set to 57 nm. In epitaxial grow of channel layer 106, a growth temperature is set to 1470° C., a growth pressure is set to 200 hPa, and a supply ratio (C/Si ratio) of a source gas is set to 1.2.

As the comparative example, a plurality of MISFETs are produced on silicon carbide wafer 301 with the method used when the example is produced, except that a growth temperature for channel layer 106 of 1550° C.

Next, thickness distributions and impurity concentration distributions in channel layers 106 within surfaces of silicon carbide epitaxial wafers 300 according to the example and the comparative example are measured. Here, in a cross-section that passes through a center of each of silicon carbide epitaxial wafers 300, thicknesses and impurity concentrations are measured at five points (p1 to p5) from one side of the periphery to another side of the periphery, and then distributions are obtained. Measurement points p1, p5 are positioned at a peripheral portion of silicon carbide epitaxial wafer 300, while measurement point p3 is positioned at a central portion of silicon carbide epitaxial wafer 300. For the plurality of MISFETs according to the example and the comparative example, gate threshold voltage Vth is measured when an ON-current is 1 mA, as well as ON-resistance Ron is measured when an ON-current is 50 A.

Figure 8A:
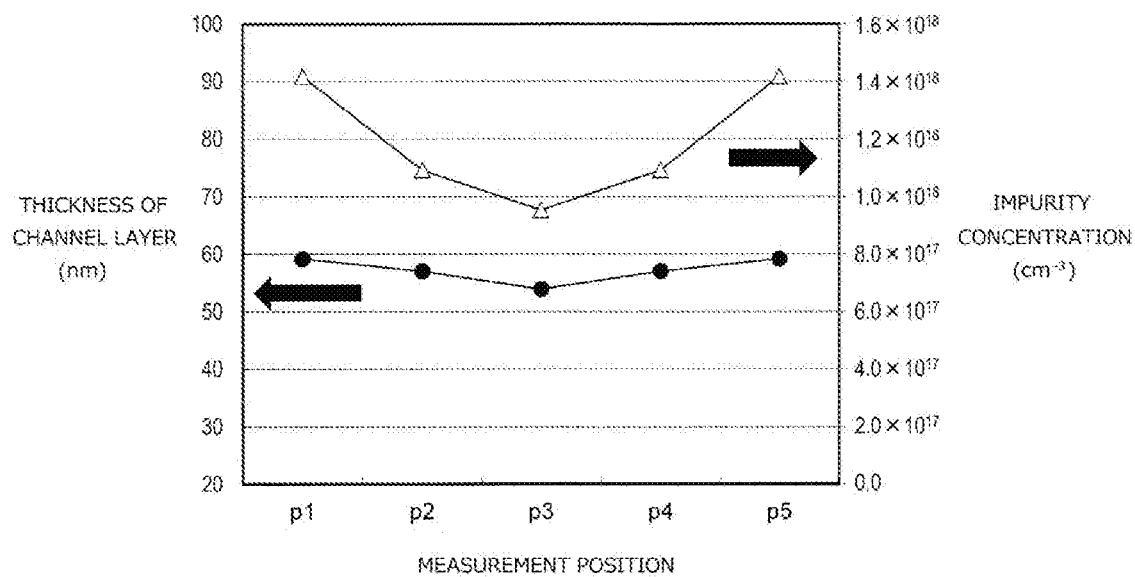
FIG. 8A is a graph showing a result of measurement on the thickness distribution and the impurity concentration distribution in the channel layer according to a comparative example.
Figure 8B:
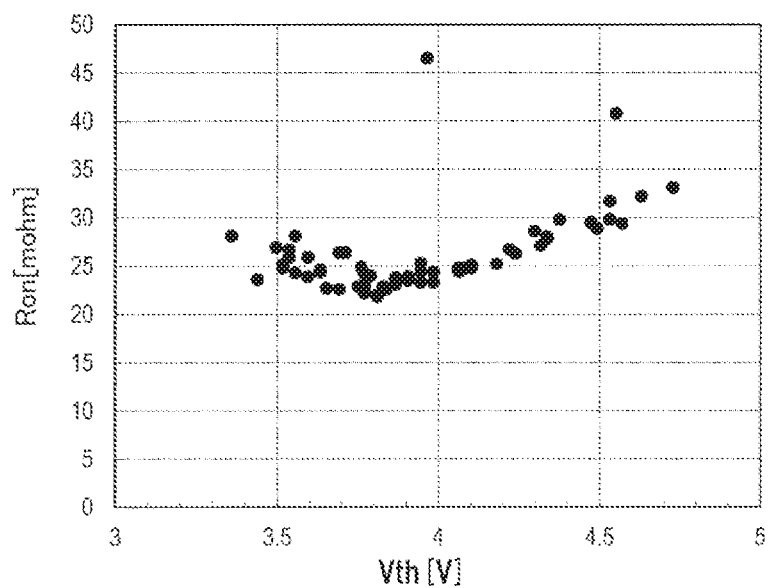
FIG. 8B is a graph showing gate threshold voltage vary and ON-resistance vary in a plurality of MISFETs according to the comparative example.
Figure 9A:
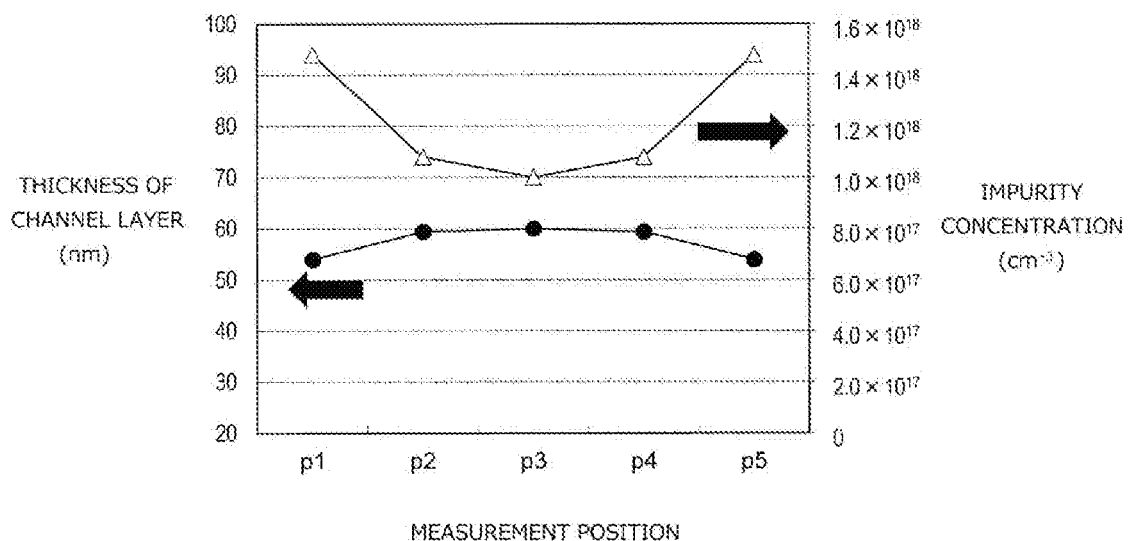
FIG. 9A is a graph showing a result of measurement on the thickness distribution and the impurity concentration distribution in the channel layer according to an example.
Figure 9B:
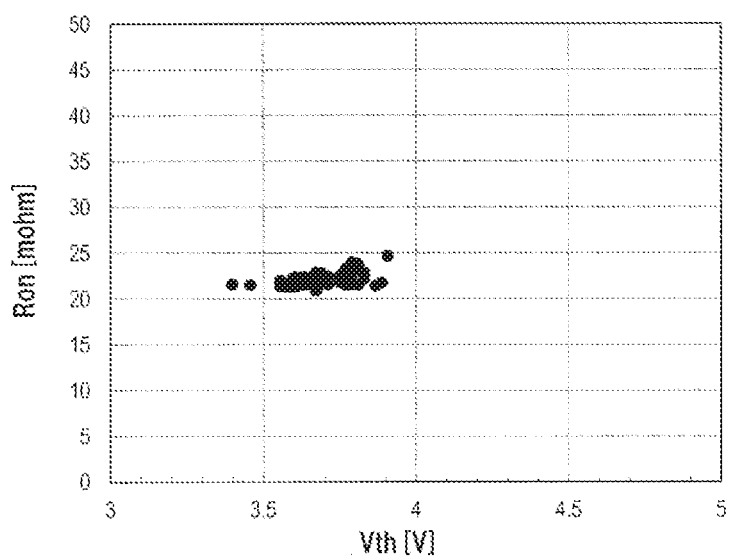
FIG. 9B is a graph showing variations of gate threshold voltage and ON-resistance in a plurality of MISFETs according to the example.

FIG. 8A is a graph showing a result of measurement on the thickness distribution and the impurity concentration distribution in channel layer 106 according to the comparative example, and FIG. 8B is a graph showing variations in gate threshold voltage Vth and ON-resistance Ron in the plurality of MISFETs according to the comparative example. FIG. 9A is a graph showing a result of measurement on the thickness distribution and the impurity concentration distribution in channel layer 106 according to the example, and FIG. 9B is a graph showing variations in gate threshold voltage Vth and ON-resistance Ron in the plurality of MISFETs according to the example.

In the comparative example, as illustrated in FIG. 8A, an impurity concentration in channel layer 106 in a center portion of silicon carbide epitaxial wafer 300 is lower than an impurity concentration in channel layer 106 in the peripheral portion of silicon carbide epitaxial wafer 300, while a thickness of channel layer 106 in the center portion of silicon carbide epitaxial wafer 300 is smaller than a thickness of channel layer 106 in the peripheral portion of silicon carbide epitaxial wafer 300. In other words, the impurity concentration distribution and the thickness distribution in channel layer 106 are positively correlated to each other. A variation in the impurity concentration is ±20% (±2×10$^{17}$ cm$^{-3}$), and a difference between a maximum value and a minimum value of the impurity concentration is 4×10$^{17}$ cm$^{-3}$. A variation in the thickness of channel layer 106 is ±5% (±3 nm), and a difference between a maximum value and a minimum value of the thickness is 6 nm. In the comparative example, as illustrated in FIG. 8B, it can be understood that gate threshold voltage Vth and ON-resistance Ron greatly vary among MISFETs formed on silicon carbide epitaxial wafer 300. For example, a variation in gate threshold voltage Vth is 1.5 V or more. This can be assumed that, since the impurity concentration distribution and the thickness distribution in channel layer 106 are positively correlated to each other, amounts of variation in Vth due to the thickness distribution and the impurity concentration distribution in channel layer 106 are added, and as a result, the amount of variation in Vth is increased.

On the other hand, in the example, as illustrated in FIG. 9A, though an impurity concentration in channel layer 106 is approximately identical to the impurity concentration observed in the comparative example, a thickness of channel layer 106 in the center portion of silicon carbide epitaxial wafer 300 is greater than a thickness of channel layer 106 in the peripheral portion of silicon carbide epitaxial wafer 300. In other words, the impurity concentration distribution and the thickness distribution in channel layer 106 are negatively correlated to each other. A variation in the impurity concentration is ±20% (±2×10$^{17}$ cm$^{-3}$), a difference between a maximum value and a minimum value of the impurity concentration is 4×10$^{17}$ cm$^{-3}$, an amount of variation in the thickness of channel layer 106 is ±5% (±3 nm), and a difference between a maximum value and a minimum value of the thickness is 6 nm. All values described above are identical to the values observed in the comparative example. In the example, as illustrated in FIG. 9B, it can be understood that variations in gate threshold voltage Vth and ON-resistance Ron are significantly reduced, compared with the comparative example. In the example, a variation in gate threshold voltage Vth is approximately 0.5 V. This can be assumed that, since the impurity concentration distribution and the thickness distribution in channel layer 106 are negatively correlated to each other, an amount of variation in Vth due to the thickness distribution in channel layer 106 is compensated by an amount of variation in Vth due to the impurity concentration distribution, and as a result, the amount of variation in Vth is reduced.

It can be therefore confirmed that, by controlling an impurity concentration distribution and a thickness distribution in channel layer 106, a variation in Vth within a surface of silicon carbide wafer 301 can be reduced.

As described above, a thickness distribution in gate insulation film 107 may be controlled so as to be positively correlated to a thickness distribution in channel layer 106. For example, channel layer 106 and gate insulation film 107 may both be formed to have a greater thickness in the center portion than a thickness in the peripheral portion. An amount of variation in Vth due to a variation in thickness of channel layer 106 can be therefore compensated by both amount of variation in Vth due to a variation in impurity concentration in channel layer 106 and amount of variation in Vth due to a variation in thickness of gate insulation film 107, a total amount of variation in Vth can thus further be reduced.

A silicon carbide semiconductor device according to the exemplary embodiment is not limited to a planar-structured vertical MISFET, but may be a trench-structured vertical MISFET. A silicon carbide semiconductor device may otherwise be a horizontal MISFET in which a source electrode and a drain electrode are disposed on a main surface of a silicon carbide wafer. A silicon carbide semiconductor device may otherwise be a junction field effect transistor (JFET), for example. A silicon carbide wafer having a conductivity type that differs from a conductivity type of silicon carbide epitaxial layer 110 may be used to produce an insulated gate bipolar transistor (IGBT).

In addition to silicon carbide, a semiconductor epitaxial wafer and a semiconductor device made of another wide bandgap semiconductor, such as gallium nitride (GaN), gallium oxide (Ga$_2$O$_3$), and diamond, are also applicable. A semiconductor epitaxial wafer and a semiconductor device made of silicon are also applicable.

The technology disclosed in the present specification is useful for, for example, use of a semiconductor device used for a power converter. In particular, it is useful for use of a power semiconductor device to be installed on an on-vehicle power converter, a power converter for industrial equipment, or the like.

What is claimed is:
1. A semiconductor epitaxial wafer comprising:
a semiconductor wafer; and
a semiconductor layer of a first conductivity type disposed on a main surface of the semiconductor wafer, wherein:
the semiconductor epitaxial wafer includes a plurality of device regions, the plurality of device regions each including:
a body region of a second conductivity type in contact with the semiconductor layer;
a source region of the first conductivity type in contact with the body region; and
a channel layer constituted by a semiconductor, the channel layer being disposed on the semiconductor layer so as to be in contact with at least a part of the body region,
the channel layer contains a first conductivity type impurity at a concentration ranging from 1×10$^{18}$ cm$^{-3}$ to 1×10$^{19}$ cm$^{-3}$, inclusive, and has a thickness ranging from 10 nm to 100 nm, inclusive, and
when thicknesses of the channel layer at two points a and b defined in the plane parallel to the main surface of the semiconductor wafer are represented by Da and Db, respectively, while concentrations of the first conductivity type impurity in the channel layer at the two points a and b are represented by Ca and Cb, respectively, an inequality of Ca<Cb is satisfied when an inequality of Da>Db is satisfied, or an inequality of Ca>Cb is satisfied when an inequality of Da<Db is satisfied.

2. The semiconductor epitaxial wafer according to claim 1, wherein: the plurality of device regions each further includes:
a gate insulation film disposed on the channel layer; and
a gate electrode disposed on the gate insulation film,
in the plane parallel to the main surface of the semiconductor wafer, the thickness distribution in the channel layer and a thickness distribution in the gate insulation film are positively correlated to each other.

3. The semiconductor epitaxial wafer according to claim 1, wherein, in the plane parallel to the main surface of the semiconductor wafer, a difference between a maximum value and a minimum value in the thickness distribution in the channel layer ranges from 2 nm to 20 nm, inclusive, and a difference between a maximum value and a minimum value in the concentration distribution of the first conductivity type impurity in the channel layer ranges from $2\times10^{17}$ $cm^{-3}$ to $2\times10^{18}$ $cm^{-3}$, inclusive.

4. The semiconductor epitaxial wafer according to claim 1, wherein:
the concentration of the first conductivity type impurity in the channel layer in a center portion of the semiconductor wafer is smaller than the concentration of the first conductivity type impurity in the channel layer in a peripheral portion of the semiconductor wafer, and
the thickness of the channel layer in the center portion of the semiconductor wafer is greater than the thickness of the channel layer in the peripheral portion of the semiconductor wafer.

5. The semiconductor epitaxial wafer according to claim 2, wherein the gate insulation film is a thermal oxide film.

6. The semiconductor epitaxial wafer according to claim 1, wherein the semiconductor wafer is a silicon carbide wafer, the semiconductor layer is a silicon carbide semiconductor layer, and the channel layer is constituted by a silicon carbide semiconductor.

7. A semiconductor device comprising:
a semiconductor substrate;
a semiconductor layer of a first conductivity type disposed on a main surface of the semiconductor substrate;
a body region of a second conductivity type in contact with the semiconductor layer;
a source region of the first conductivity type in contact with the body region; and
a channel layer constituted by a semiconductor, the channel layer being disposed on the semiconductor layer so as to be in contact with at least a part of the body region,
the channel layer contains a first conductivity type impurity at a concentration ranging from $1\times10^{18}$ $cm^{-3}$ to $1\times10^{19}$ $cm^{-3}$, inclusive, and has a thickness ranging from 10 nm to 100 nm, inclusive,
when thicknesses of the channel layer at two points a and b defined in the plane parallel to the main surface of the semiconductor wafer are represented by Da and Db, respectively, while concentrations of the first conductivity type impurity in the channel layer at the two points a and b are represented by Ca and Cb, respectively, an inequality of Ca<Cb is satisfied when an inequality of Da>Db is satisfied, or an inequality of Ca>Cb is satisfied when an inequality of Da<Db is satisfied, and
in the plane parallel to the main surface of the semiconductor substrate, a difference between a maximum value and a minimum value in the thickness distribution in the channel layer ranges from 1 nm to 5 nm, inclusive, and a difference between a maximum value and a minimum value in the concentration distribution of the first conductivity type impurity in the channel layer ranges from $1\times10^{17}$ $cm^{-3}$ to $1\times10^{18}$ $cm^{-3}$, inclusive.

8. The semiconductor device according to claim 7, further comprising:
a gate insulation film disposed on the channel layer; and
a gate electrode disposed on the gate insulation film,
wherein, in the plane parallel to the main surface of the semiconductor substrate, the thickness distribution in the channel layer and a thickness distribution in the gate insulation film are positively correlated to each other.

9. The semiconductor device according to claim 7, wherein the semiconductor substrate is a silicon carbide substrate, the semiconductor layer is a silicon carbide semiconductor layer, and the channel layer is constituted by a silicon carbide semiconductor.

10. A semiconductor device comprising:
a semiconductor substrate;
a semiconductor layer of a first conductivity type disposed on a main surface of the semiconductor substrate;
a body region of a second conductivity type in contact with the semiconductor layer;
a source region of the first conductivity type in contact with the body region; and
a channel layer constituted by a semiconductor, the channel layer being disposed on the semiconductor layer so as to be in contact with at least a part of the body region,
the channel layer contains a first conductivity type impurity at a concentration ranging from $1\times10^{18}$ $cm^{-3}$ to $1\times10^{19}$ $cm^{-3}$, inclusive, and has a thickness ranging from 10 nm to 100 nm, inclusive, and
in a plane parallel to the main surface of the semiconductor substrate, a thickness distribution in the channel layer and a concentration distribution of the first conductivity type impurity in the channel layer are negatively correlated to each other, and
in the plane parallel to the main surface of the semiconductor substrate, a difference between a maximum value and a minimum value in the thickness distribution in the channel layer ranges from 1 nm to 2 nm, inclusive, and a difference between a maximum value and a minimum value in the concentration distribution of the first conductivity type impurity in the channel layer ranges from $1\times10^{17}$ $cm^{-3}$ to $2\times10^{17}$ $cm^{-3}$, inclusive.

11. The semiconductor device according to claim 10, further comprising:
a gate insulation film disposed on the channel layer; and
a gate electrode disposed on the gate insulation film,
wherein, in the plane parallel to the main surface of the semiconductor substrate, the thickness distribution in the channel layer and a thickness distribution in the gate insulation film are positively correlated to each other.

12. The semiconductor device according to claim 10, wherein the semiconductor substrate is a silicon carbide substrate, the semiconductor layer is a silicon carbide semiconductor layer, and the channel layer is constituted by a silicon carbide semiconductor.

13. A semiconductor epitaxial wafer comprising:
a semiconductor wafer; and
a semiconductor layer of a first conductivity type disposed on a main surface of the semiconductor wafer, wherein:
the semiconductor epitaxial wafer includes a plurality of device regions, the plurality of device regions each including:
- a body region of a second conductivity type in contact with the semiconductor layer;
- a source region of the first conductivity type in contact with the body region; and
- a channel layer constituted by a semiconductor, the channel layer being disposed on the semiconductor layer so as to be in contact with at least a part of the body region, the channel layer contains a first conductivity type impurity at a concentration ranging from $1\times10^{18}$ $cm^{-3}$ to $1\times10^{19}$ $cm^{-3}$, inclusive, and has a thickness ranging from 10 nm to 100 nm, inclusive,
in a plane parallel to the main surface of the semiconductor wafer, a thickness distribution in the channel layer and a concentration distribution of the first conductivity type impurity in the channel layer are negatively correlated to each other, and
in the plane parallel to the main surface of the semiconductor wafer, a difference between a maximum value and a minimum value in the thickness distribution in the channel layer ranges from 2 nm to 20 nm, inclusive, and a difference between a maximum value and a minimum value in the concentration distribution of the first conductivity type impurity in the channel layer ranges from $2\times10^{17}$ $cm^{-3}$ to $2\times10^{18}$ $cm^{-3}$, inclusive.

14. A semiconductor epitaxial wafer comprising:
a semiconductor wafer; and
a semiconductor layer of a first conductivity type disposed on a main surface of the semiconductor wafer, wherein:
the semiconductor epitaxial wafer includes a plurality of device regions, the plurality of device regions each including:
- a body region of a second conductivity type in contact with the semiconductor layer;
- a source region of the first conductivity type in contact with the body region; and
- a channel layer constituted by a semiconductor, the channel layer being disposed on the semiconductor layer so as to be in contact with at least a part of the body region, the channel layer contains a first conductivity type impurity at a concentration ranging from $1\times10^{18}$ $cm^{-3}$ to $1\times10^{19}$ $cm^{-3}$, inclusive, and has a thickness ranging from 10 nm to 100 nm, inclusive,
in a plane parallel to the main surface of the semiconductor wafer, a thickness distribution in the channel layer and a concentration distribution of the first conductivity type impurity in the channel layer are negatively correlated to each other,
the concentration of the first conductivity type impurity in the channel layer in a center portion of the semiconductor wafer is smaller than the concentration of the first conductivity type impurity in the channel layer in a peripheral portion of the semiconductor wafer, and
the thickness of the channel layer in the center portion of the semiconductor wafer is greater than the thickness of the channel layer in the peripheral portion of the semiconductor wafer.

15. A semiconductor device comprising:
a semiconductor substrate;
a semiconductor layer of a first conductivity type disposed on a main surface of the semiconductor substrate;
a body region of a second conductivity type in contact with the semiconductor layer;
a source region of the first conductivity type in contact with the body region; and
a channel layer constituted by a semiconductor, the channel layer being disposed on the semiconductor layer so as to be in contact with at least a part of the body region,
the channel layer contains a first conductivity type impurity at a concentration ranging from $1\times10^{18}$ $cm^{-3}$ to $1\times10^{19}$ $cm^{-3}$, inclusive, and has a thickness ranging from 10 nm to 100 nm, inclusive,
in a plane parallel to the main surface of the semiconductor substrate, a thickness distribution in the channel layer and a concentration distribution of the first conductivity type impurity in the channel layer are negatively correlated to each other, and
in the plane parallel to the main surface of the semiconductor substrate, a difference between a maximum value and a minimum value in the thickness distribution in the channel layer ranges from 1 nm to 5 nm, inclusive, and a difference between a maximum value and a minimum value in the concentration distribution of the first conductivity type impurity in the channel layer ranges from $1\times10^{17}$ $cm^{-3}$ to $1\times10^{18}$ $cm^{-3}$, inclusive.

* * * * *